(12) United States Patent
Machler et al.

(10) Patent No.: US 10,744,603 B2
(45) Date of Patent: Aug. 18, 2020

(54) HEAT EXCHANGERS WITH PLATES HAVING SURFACE PATTERNS FOR ENHANCING FLATNESS AND METHODS FOR MANUFACTURING SAME

(71) Applicant: Dana Canada Corporation, Oakville (CA)

(72) Inventors: Meinrad K. A. Machler, Oakville (CA); Michael A. Martin, Hamilton (CA); Domen M. S. Lo, Mississauga (CA); Carlos Enrique Rozas Herrera, Burlington (CA)

(73) Assignee: DANA CANADA CORPORATION, Oakville (CA)

( * ) Notice: Subject to any disclaimer, the term of this patent is extended or adjusted under 35 U.S.C. 154(b) by 127 days.

(21) Appl. No.: 15/071,283

(22) Filed: Mar. 16, 2016

(65) Prior Publication Data

US 2016/0273842 A1    Sep. 22, 2016

Related U.S. Application Data

(60) Provisional application No. 62/133,664, filed on Mar. 16, 2015, provisional application No. 62/133,650, filed on Mar. 16, 2015.

(51) Int. Cl.
*F28F 3/04*     (2006.01)
*H01L 23/473*   (2006.01)
(Continued)

(52) U.S. Cl.
CPC .............. *B23P 15/26* (2013.01); *F28F 3/048* (2013.01); *F28F 3/12* (2013.01); *H01L 23/473* (2013.01);
(Continued)

(58) Field of Classification Search
CPC .. F28F 3/042; F28F 3/046; F28F 3/048; F28F 3/12; H01L 24/83; H01L 2224/82385;
(Continued)

(56) References Cited

U.S. PATENT DOCUMENTS 5,345,107 A * 9/1994 Daikoku ............... H01L 23/473
165/185
RE35,890 E    9/1998 So
(Continued)

FOREIGN PATENT DOCUMENTS

CA   2803972 A1   1/2012
CN   102693949 A   9/2012
(Continued)

OTHER PUBLICATIONS

Chinese Office Action dated Feb. 3, 2019 issued in Application No. 201680014708.X.

*Primary Examiner* — Eric S Ruppert
*Assistant Examiner* — Hans R Weiland
(74) *Attorney, Agent, or Firm* — McCoy Russell LLP

(57) ABSTRACT

A heat exchanger has a thermally conductive first plate with a flat first surface for thermal contact with a heat transfer fluid, and a flat second surface for thermal contact with an object to be heated or cooled, such as an electronic component. The first surface is provided with a first surface pattern having a plurality of first grooves, and the second surface is provided with a second surface pattern with a plurality of second grooves. The surface patterns may be configured and applied such that the amount of elongation along the first surface produced by application of the first surface pattern substantially corresponds to or offsets the amount of elongation along the second surface produced by application of the second surface pattern, such that the degree of flatness of
(Continued)

the first plate prior to formation of the first and second surface patterns will be preserved, maintained or improved.

20 Claims, 19 Drawing Sheets

(51) Int. Cl.
*B23P 15/26* (2006.01)
*F28F 3/12* (2006.01)

(52) U.S. Cl.
CPC .............. H01L 2224/82385 (2013.01); H01L 2224/83385 (2013.01)

(58) Field of Classification Search
CPC ......... H01L 2224/83385; H01L 23/367; H01L 23/3675; H01L 23/473; B23P 15/26
See application file for complete search history.

(56) References Cited

U.S. PATENT DOCUMENTS

| | | | |
|---|---|---|---|
| 5,803,811 A | 9/1998 | Fechter | |
| 5,825,087 A * | 10/1998 | Iruvanti | H01L 21/4878 |
| | | | 257/706 |
| 6,273,183 B1 | 8/2001 | So et al. | |
| 6,365,964 B1 | 4/2002 | Koors et al. | |
| 6,424,529 B2 | 7/2002 | Eesley et al. | |
| 6,424,531 B1 | 7/2002 | Bhatti et al. | |
| 6,550,533 B2 | 4/2003 | Nakado et al. | |
| 6,560,110 B1 | 5/2003 | Myers et al. | |
| 6,639,798 B1 | 10/2003 | Jeter et al. | |
| 6,653,741 B2 | 11/2003 | Sreeram et al. | |
| 6,700,195 B1 | 3/2004 | Mandel | |
| 6,703,128 B2 | 3/2004 | Myers et al. | |
| 6,804,118 B2 | 10/2004 | Kataria | |
| 6,812,553 B2 | 11/2004 | Gerbsch et al. | |
| 6,821,816 B1 | 11/2004 | Lawlyes | |
| 6,822,868 B2 | 11/2004 | Buehler et al. | |
| 6,873,043 B2 | 3/2005 | Oman | |
| 6,918,431 B2 | 7/2005 | Reyzin et al. | |
| 6,943,293 B1 | 9/2005 | Jeter et al. | |
| 6,998,706 B2 | 2/2006 | Lawlyes | |
| 6,999,317 B2 | 2/2006 | Chengalva et al. | |
| 7,064,963 B2 | 6/2006 | Oman et al. | |
| 7,077,189 B1 | 7/2006 | Reyzin et al. | |
| 7,095,098 B2 | 8/2006 | Gerbsch et al. | |
| 7,132,746 B2 | 11/2006 | Brandenburg et al. | |
| 7,187,083 B2 | 3/2007 | Lewis et al. | |
| 7,205,653 B2 | 4/2007 | Brandenburg et al. | |
| 7,215,547 B2 | 5/2007 | Chang et al. | |
| 7,230,829 B2 | 6/2007 | Mandel et al. | |
| 7,230,832 B2 | 6/2007 | Brandenburg et al. | |
| 7,294,926 B2 | 11/2007 | Schubert et al. | |
| 7,295,433 B2 | 11/2007 | Taylor et al. | |
| 7,324,342 B2 | 1/2008 | Taylor et al. | |
| 7,352,585 B2 | 4/2008 | Mandel et al. | |
| 7,365,981 B2 | 4/2008 | Myers et al. | |
| 7,411,290 B2 | 8/2008 | Lee et al. | |
| 7,485,957 B2 | 2/2009 | Brandenburg et al. | |
| 7,537,151 B2 | 5/2009 | Bhatti et al. | |
| 7,538,425 B2 | 5/2009 | Myers et al. | |
| 7,551,439 B2 | 6/2009 | Peugh et al. | |
| 7,561,436 B2 | 7/2009 | Brandenburg et al. | |
| 7,564,128 B2 | 7/2009 | Oman | |
| 7,608,924 B2 | 10/2009 | Myers et al. | |
| 7,659,615 B2 | 2/2010 | Oman | |
| 7,663,242 B2 | 2/2010 | Lewis et al. | |
| 7,697,303 B2 | 4/2010 | Mock et al. | |
| 7,724,526 B2 | 5/2010 | Hinze et al. | |
| 7,739,791 B2 | 6/2010 | Brandenburg et al. | |
| 7,759,778 B2 | 7/2010 | Lowry et al. | |
| 7,782,616 B1 | 8/2010 | Myers et al. | |
| 7,795,726 B2 | 9/2010 | Myers et al. | |
| 7,834,448 B2 | 11/2010 | Gerbsch | |
| 7,876,562 B2 | 1/2011 | Visser | |
| 7,960,817 B2 | 6/2011 | Gerbsch et al. | |
| 7,983,046 B1 | 7/2011 | Borzabadi et al. | |
| 8,026,597 B2 | 9/2011 | Brandenburg et al. | |
| 8,042,606 B2 * | 10/2011 | Batty | F28D 15/046 |
| | | | 165/104.26 |
| 8,056,303 B2 | 11/2011 | Frobosilo | |
| 8,061,412 B2 * | 11/2011 | Ippoushi | H01L 23/473 |
| | | | 165/185 |
| 8,094,454 B2 | 1/2012 | Lowry | |
| 8,313,215 B1 | 11/2012 | Wawak-Umscheid et al. | |
| 8,345,425 B2 * | 1/2013 | Toyoda | H01L 23/427 |
| | | | 165/104.26 |
| 8,471,380 B2 | 6/2013 | Brandenburg et al. | |
| 8,485,853 B2 | 7/2013 | Seifert et al. | |
| 8,488,321 B2 | 7/2013 | Brandenburg et al. | |
| 8,695,821 B2 | 4/2014 | Bashyam | |
| 8,699,225 B2 | 4/2014 | Brandenburg et al. | |
| 8,754,512 B1 | 6/2014 | Taylor et al. | |
| 8,760,253 B2 | 6/2014 | Hickox | |
| 8,797,739 B2 | 8/2014 | Brandenburg et al. | |
| 9,131,630 B2 | 9/2015 | Brandenburg et al. | |
| 9,243,855 B2 * | 1/2016 | Koizuka | H01L 23/473 |
| 2005/0218505 A1 | 10/2005 | Oman et al. | |
| 2006/0096743 A1 * | 5/2006 | Lee | H01L 23/473 |
| | | | 165/104.33 |
| 2006/0238984 A1 * | 10/2006 | Belady | H01L 23/367 |
| | | | 361/704 |
| 2007/0056711 A1 | 3/2007 | Ohsawa | |
| 2008/0128895 A1 | 6/2008 | Oman et al. | |
| 2008/0135214 A1 * | 6/2008 | Ohsawa | H01L 23/427 |
| | | | 165/104.27 |
| 2009/0001546 A1 | 1/2009 | Flederbach et al. | |
| 2009/0139704 A1 * | 6/2009 | Otoshi | H01L 23/367 |
| | | | 165/185 |
| 2011/0132591 A1 | 6/2011 | Morino et al. | |
| 2012/0034111 A1 | 2/2012 | Schiffhauer et al. | |
| 2012/0037346 A1 | 2/2012 | Kim et al. | |
| 2012/0175093 A1 | 7/2012 | Bauer et al. | |
| 2012/0241133 A1 | 9/2012 | Yan et al. | |
| 2012/0292001 A1 | 11/2012 | Traub et al. | |
| 2012/0312818 A1 | 12/2012 | Ekkert | |
| 2013/0327513 A1 * | 12/2013 | Franz | F28F 3/048 |
| | | | 165/185 |
| 2014/0182825 A1 | 7/2014 | Corbach et al. | |
| 2014/0224452 A1 | 8/2014 | Abels | |
| 2014/0225363 A1 | 8/2014 | Burgers et al. | |
| 2015/0116944 A1 | 4/2015 | Vadas et al. | |
| 2015/0171578 A1 | 6/2015 | Taylor et al. | |

FOREIGN PATENT DOCUMENTS

| | | |
|---|---|---|
| CN | 102713489 A | 10/2012 |
| CN | 103026164 A | 4/2013 |
| CN | 202889855 U | 4/2013 |
| WO | 2008020934 A2 | 2/2008 |
| WO | 2010115181 A2 | 10/2010 |
| WO | 2011087474 A1 | 7/2011 |
| WO | 2012154148 A2 | 11/2012 |

* cited by examiner

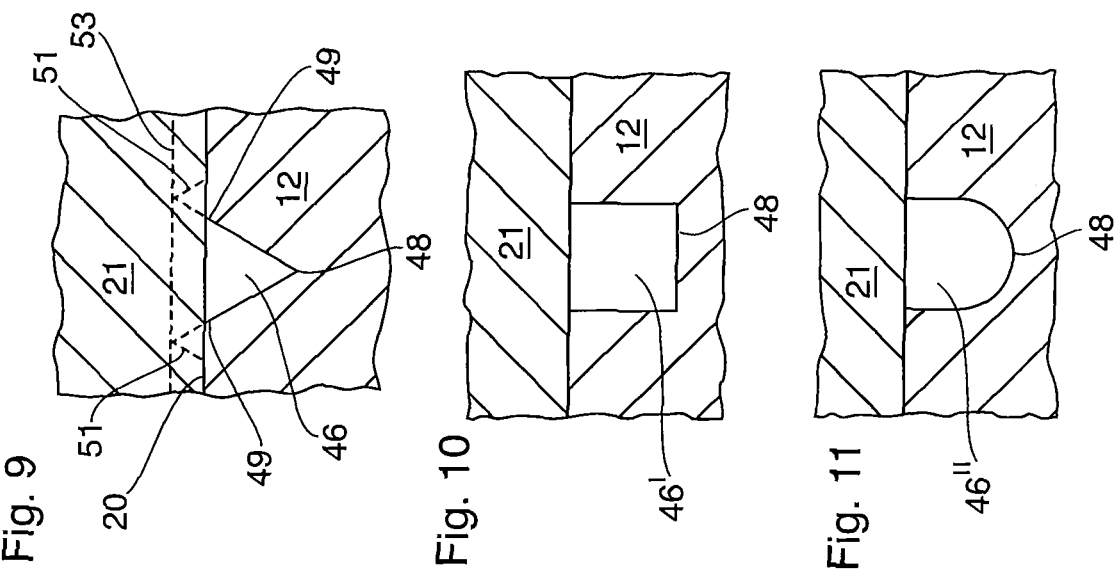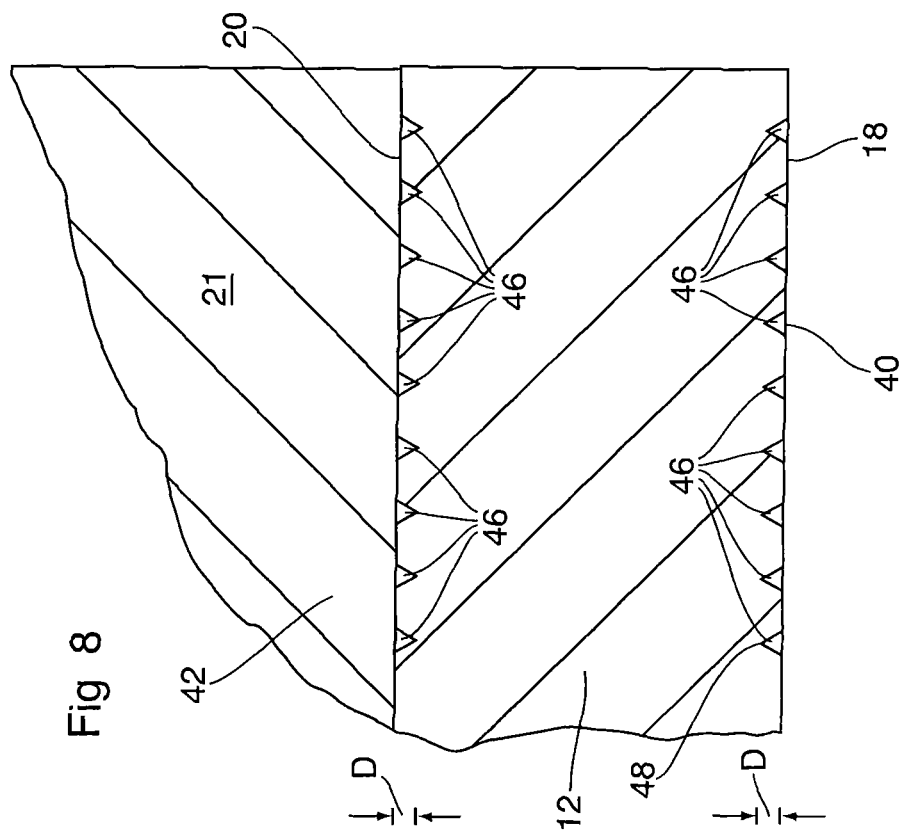

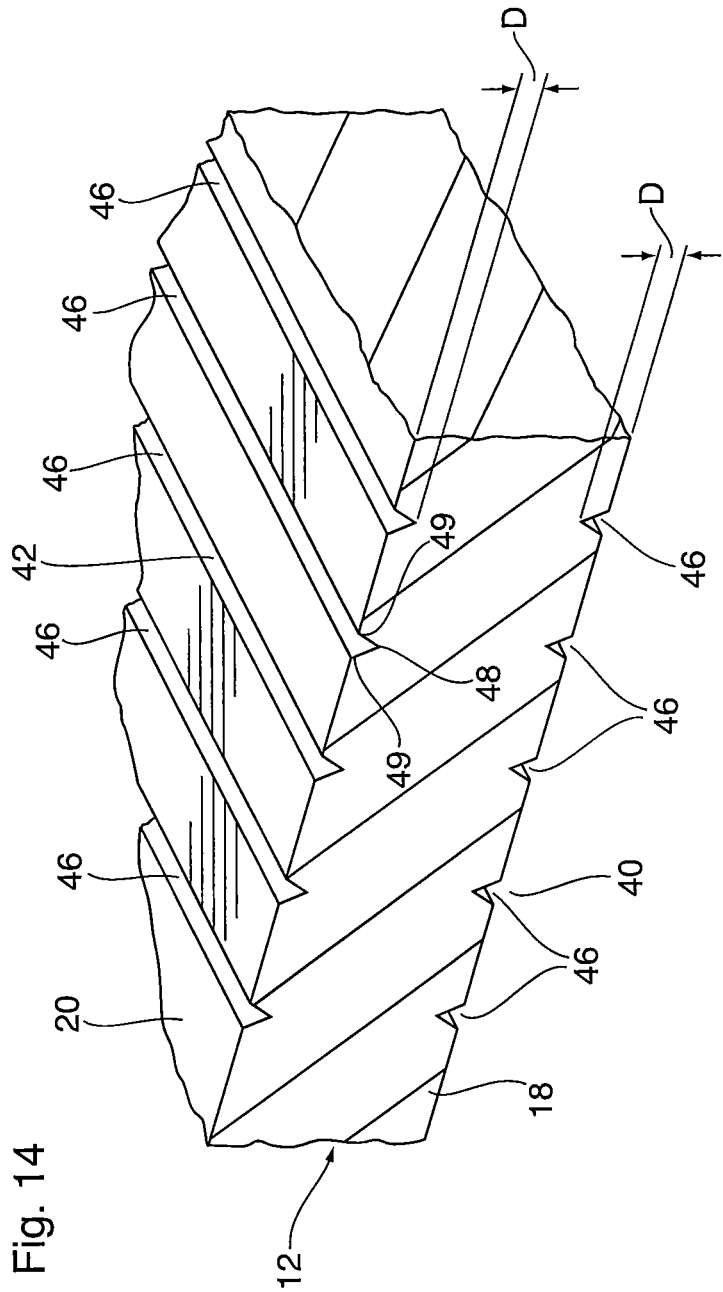

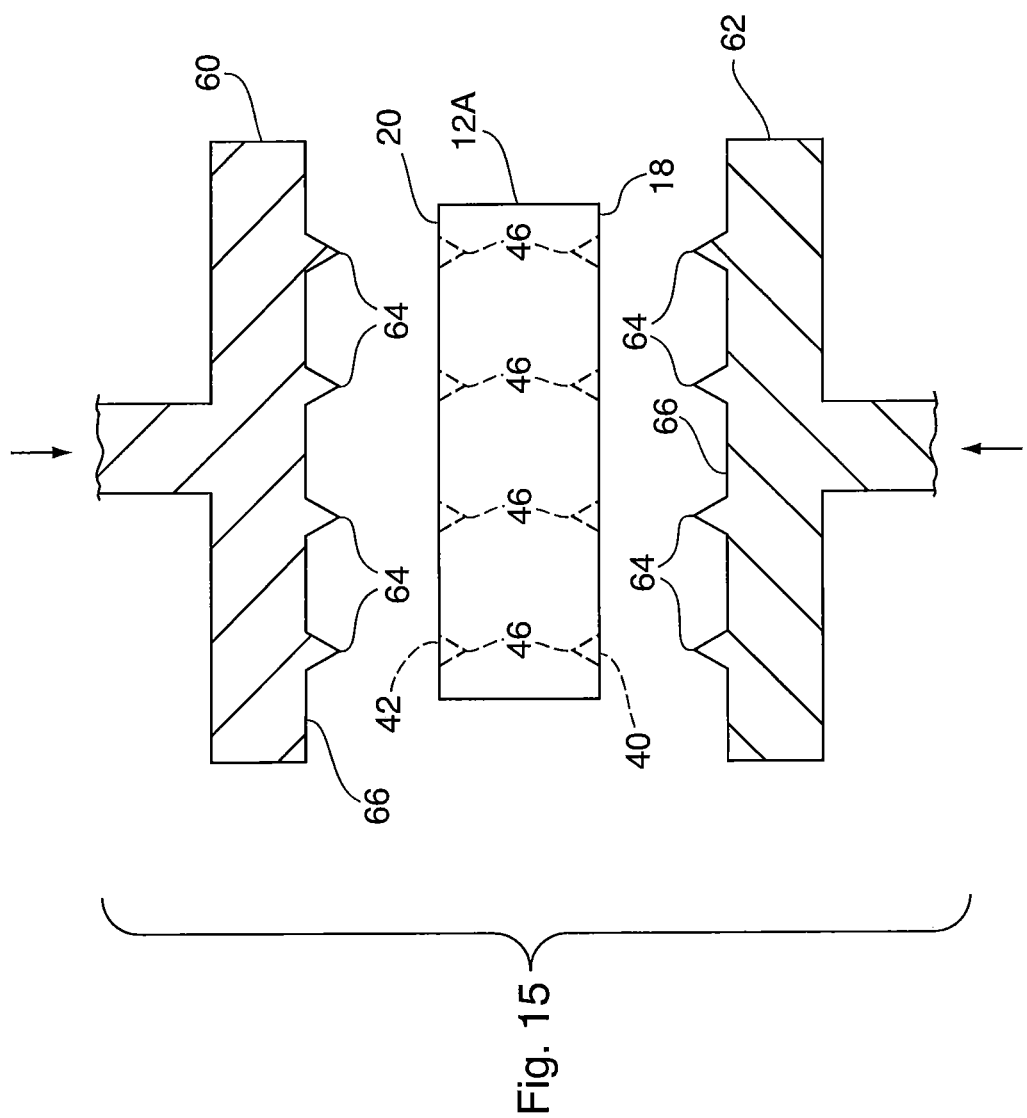

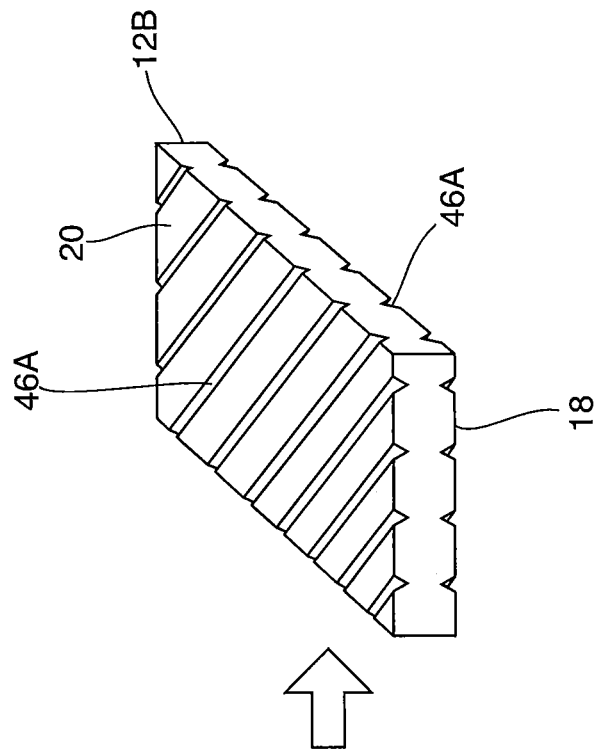
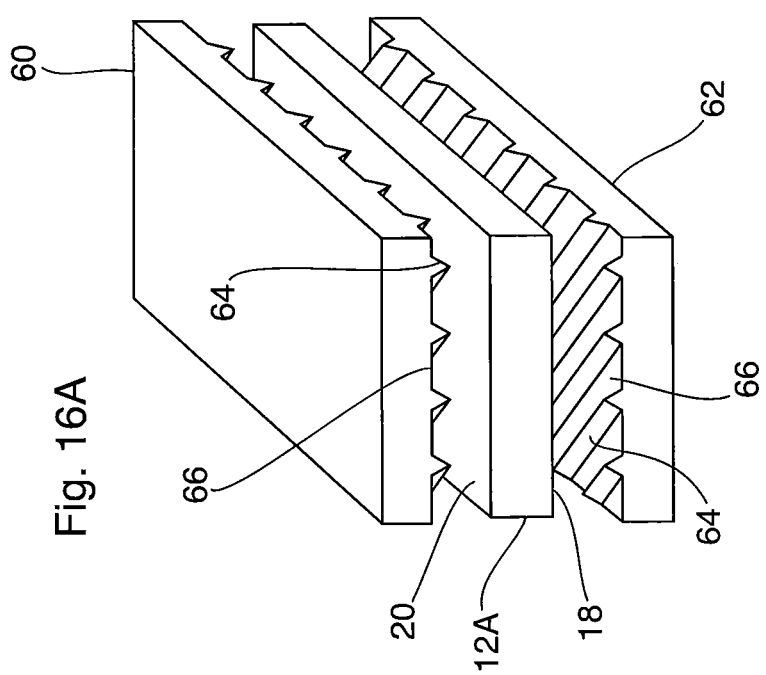

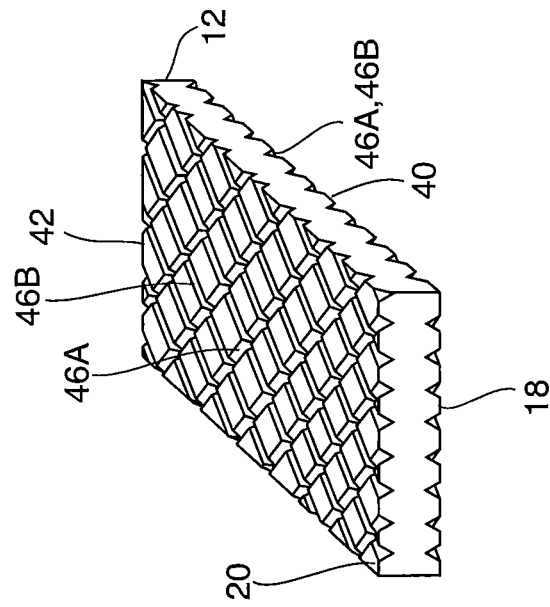
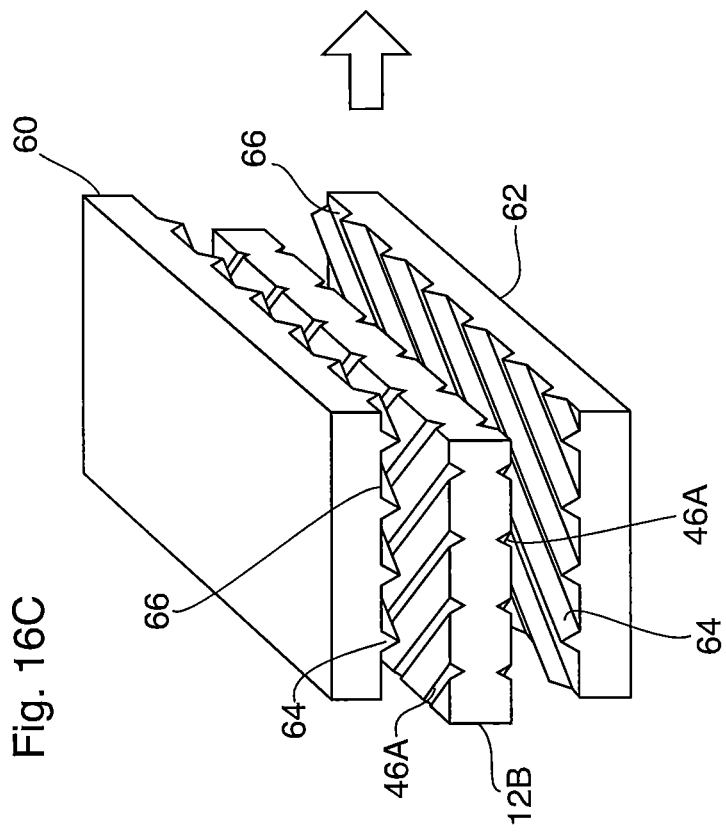

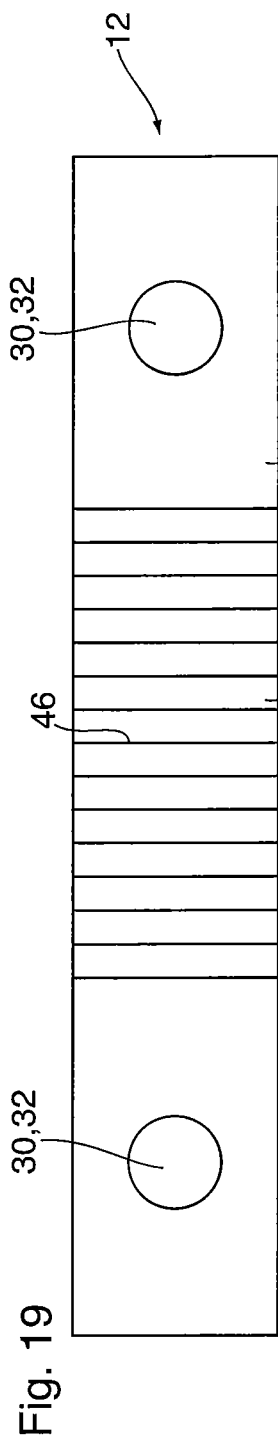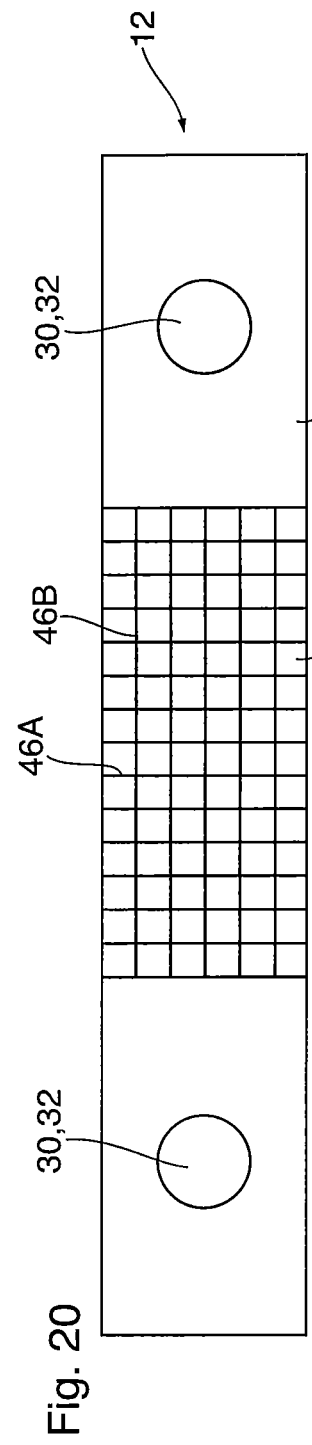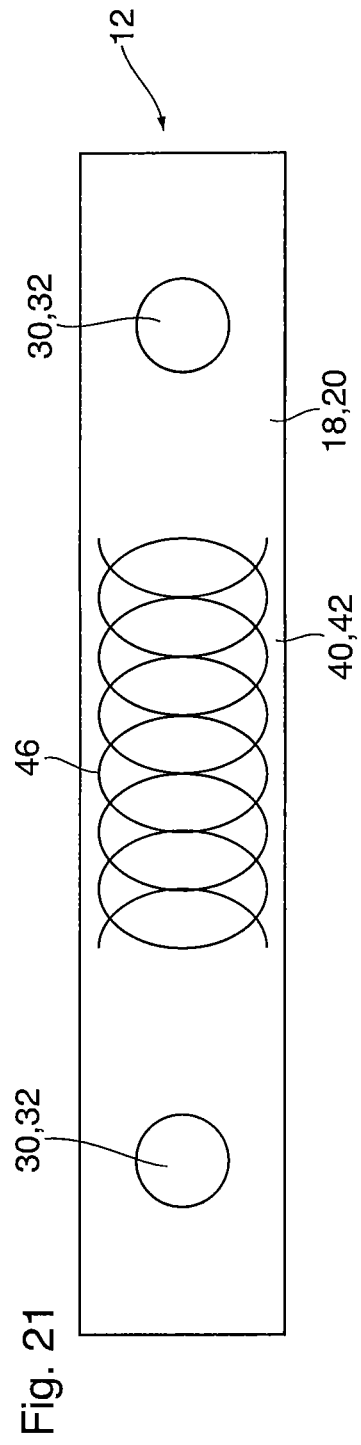

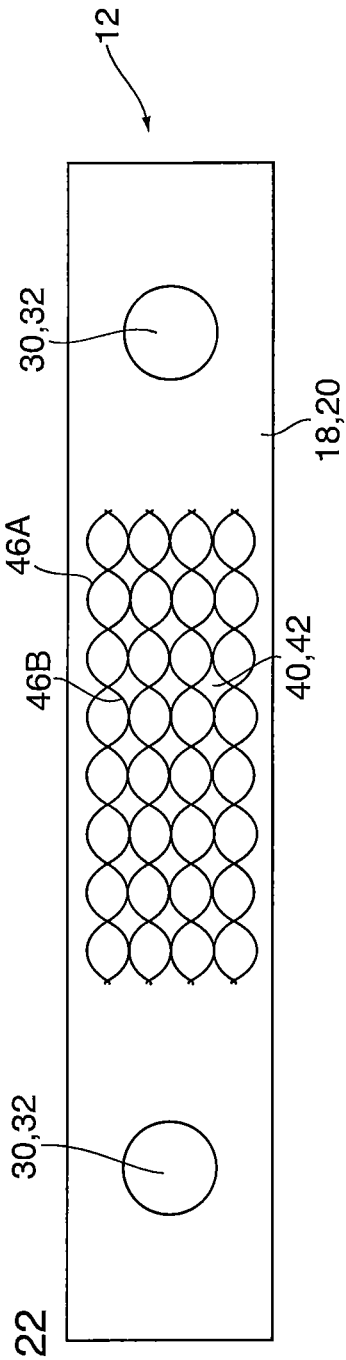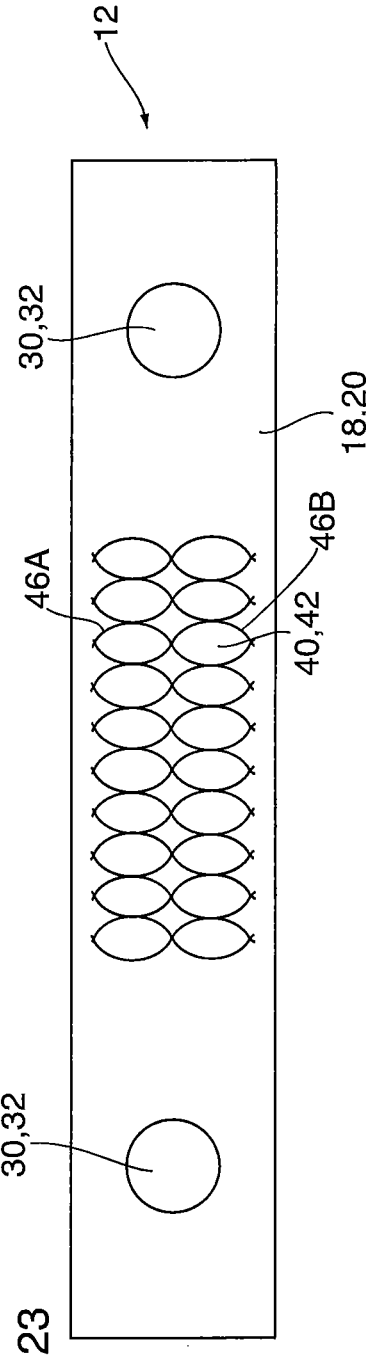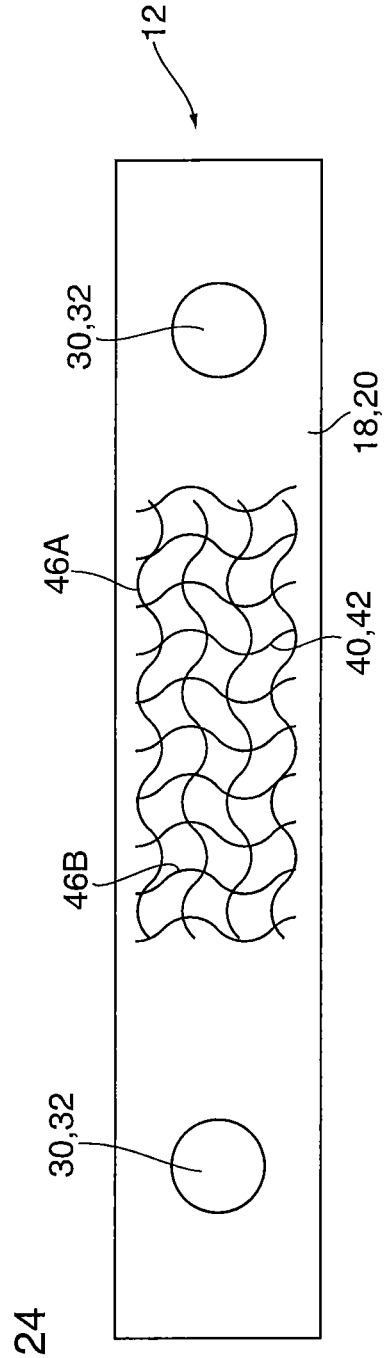

HEAT EXCHANGERS WITH PLATES HAVING SURFACE PATTERNS FOR ENHANCING FLATNESS AND METHODS FOR MANUFACTURING SAME

CROSS-REFERENCE TO RELATED APPLICATIONS

This application claims priority to and the benefit of U.S. Provisional Patent Application No. 62/133,650 and U.S. Provisional Patent Application No. 62/133,664, both filed on Mar. 16, 2015; the contents of which are incorporated herein by reference.

FIELD OF THE INVENTION

The invention generally relates to heat exchangers including one or more plates having first and second flat surfaces, and to methods for manufacturing such heat exchangers. More particularly, the heat exchangers disclosed herein include at least one plate having surface patterns on opposed first and second surfaces to maintain and/or improve its flatness.

BACKGROUND OF THE INVENTION

Some heat exchangers include at least one heat transfer plate having a first surface which is to be thermally contacted with a heat transfer fluid, and an opposed second surface which is to be thermally contacted with an object to be heated or cooled. In such a heat exchanger, heat is transferred through the heat transfer plate between the object to be heated or cooled and the heat transfer fluid.

Providing the heat transfer plate with a high degree of flatness along one or both of its first and second surfaces may be important for a number of reasons. For example, a flat second surface minimizes gaps between the heat transfer plate and the object to be heated or cooled, thereby enhancing thermal contact with the object to be cooled, and maximizing heat transfer. Flatness of the first surface may be desirable to allow the heat transfer plate to bond to an adjacent plate, for example through a brazed or welded joint, to form a circulation channel for the heat transfer fluid along the first surface of the heat transfer plate.

In some applications the second surface of the heat transfer plate may be required to have a surface pattern, for example to enhance contact with the object to be heated or cooled. However, the inventors have discovered that it is difficult to provide an adequate degree of flatness in the above-mentioned heat transfer plates. As a result, the above objectives may not be met on a consistent basis, leading to an excessively high failure rate and/or non-optimal performance of the heat exchanger.

There remains a need for an improved heat exchanger construction and manufacturing method which will ensure adequate flatness of the heat transfer plates.

SUMMARY OF THE INVENTION

In one aspect, there is provided a heat exchanger comprising a thermally conductive first plate having a flat first surface adapted for thermal contact with a heat transfer fluid, and a flat second surface adapted for thermal contact with an object to be heated or cooled. The first surface is provided with a first surface pattern comprising a plurality of first grooves, each of the first grooves having a base; and the second surface is provided with a second surface pattern comprising a plurality of second grooves, each of the second grooves having a base.

In another aspect, there is provided a method for manufacturing a heat exchanger comprising a thermally conductive first plate having a flat first surface adapted for thermal contact with a heat transfer fluid, and a flat second surface adapted for thermal contact with an object to be heated or cooled. The method comprises: (a) forming a first surface pattern on the first surface, wherein the first surface pattern comprises a plurality of first grooves, each of the first grooves having a base; and (b) forming a second surface pattern on the second surface, wherein the second surface pattern comprises a plurality of second grooves, each of the second grooves having a base.

BRIEF DESCRIPTION OF THE DRAWINGS

The embodiments will now be described, by way of example only, with reference to the accompanying drawings in which:

FIG. 8 is a partial, enlarged cross-section along line 8-8' of FIG. 4;

FIG. 9 is a close-up view of one of the V-shaped grooves of FIG. 8;

FIG. 10 is a close-up view of an alternate groove;

FIG. 11 is a close-up view of an alternate groove;

FIG. 14 is a perspective view of a portion of a first plate having first and second surface patterns;

FIG. 15 illustrates a method for manufacturing a first plate having first and second surface patterns;

FIGS. 16A to 16D illustrate a multi-step method for manufacturing a first plate having internal and external surface patterns;

FIGS. 19 to 25 each show a plan view of a first plate, showing an alternate first or second surface pattern with straight and/or curved grooves.

DETAILED DESCRIPTION

Figure 1:
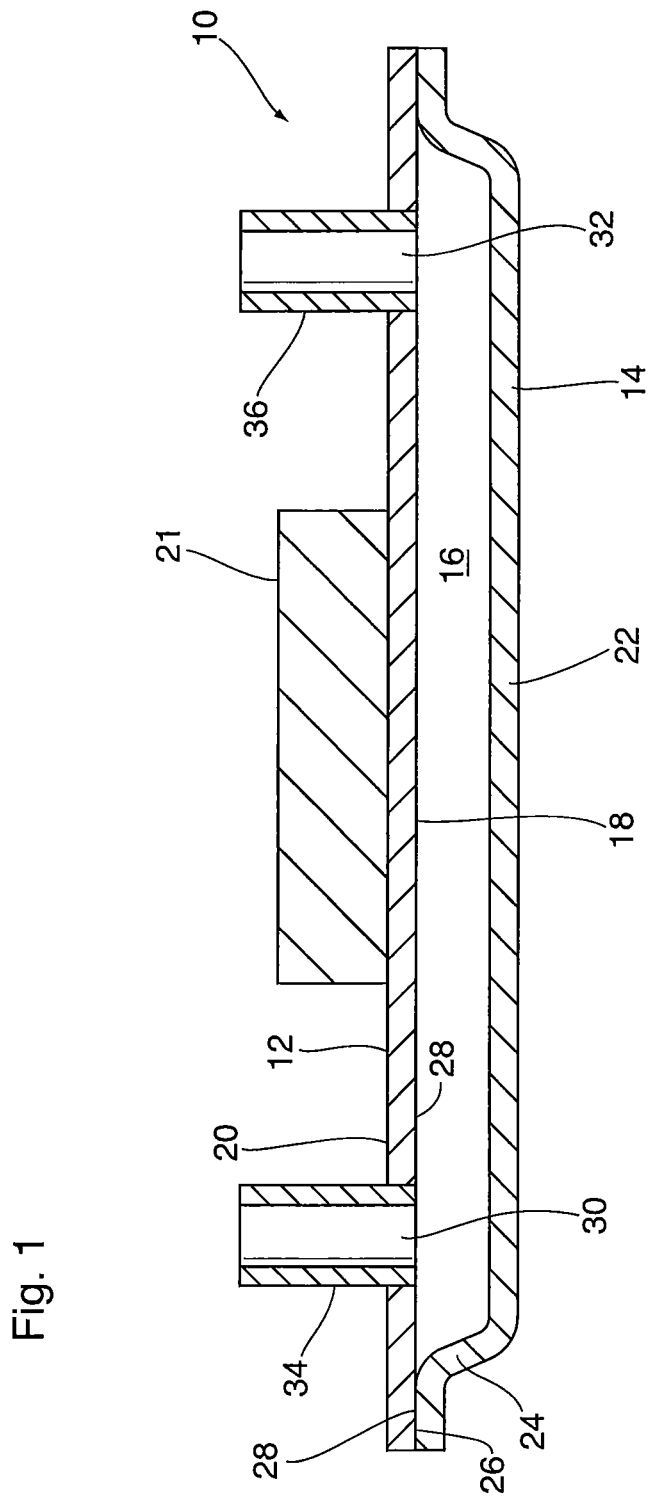
FIG. 1 is a cross-sectional side elevation of a heat exchanger according to an embodiment.

A heat exchanger 10 according to an embodiment of the invention is now described below with reference to the drawings.

Heat exchanger 10 comprises a first plate 12 and a second plate 14 sealed together at their peripheral edges, with areas of said first and second plates 12, 14 located inwardly of the peripheral edges being spaced apart to define a fluid flow passage 16 for a heat transfer fluid between the plates 12, 14.

At least the first plate 12 is a heat transfer plate having a first surface 18 (also referred to herein as the "internal surface") which is to be thermally contacted with a heat transfer fluid, and which faces toward the fluid flow passage 16 and the second plate 14. First plate 12 also has an opposed second surface 20 (also referred to herein as the "external surface") to be contacted with at least one object 21 to be heated or cooled.

The second plate 14 of heat exchanger 10 is shaped, for example by stamping, and has a flat, planar base 22 surrounded on all sides by a raised peripheral flange 24 having a peripheral sealing surface 26 along which the second plate 14 is sealed to a peripheral sealing surface 28 on the internal surface 18 of the first plate 12, for example by brazing or welding.

As used herein, the word "contact" used with reference to the first and second surfaces 18, 20 of first plate 12 means "thermal contact", in the sense that heat is transferred through first plate 12 and surfaces 18, 20 thereof, between the heat transfer fluid and the object 21. Unless specifically stated to the contrary, the word "contact", as used herein, is not to be interpreted as requiring direct physical contact between surfaces 18, 20 and the respective heat transfer fluid and object 21. Rather, it will be appreciated that surfaces which are in thermal contact are not necessarily in direct physical contact with one another, but may rather be separated by an intermediate component, layer or substance. For example, the first surface 18 of first plate 12 may be in thermal contact with the heat transfer fluid in fluid flow passage 16 through an intermediate plate, sheet or shim. Also, the second surface 20 of first plate 12 may be in thermal contact with object 21 through an intermediate substance such as a thermal interface material (TIM), which is identified by reference numeral 23 in the variant of heat exchanger 10 shown in FIG. 2, discussed below.

Heat exchanger 10 described herein may be applied to the cooling of electronic components such as insulated-gate bipolar transistors (IGBTs), in which case the "object 21" will comprise one or more power transistors requiring cooling. Where heat exchanger 10 is adapted for this application, the second surface 20 of the first plate 12 is adapted for intimate thermal contact with one or more objects 21 to be cooled. Examples of such heat exchangers are disclosed in commonly assigned US 2014/0225363 A1 and US 2014/0224452 A1, which are incorporated herein by reference in their entireties. The opposed first surface 18 of first plate 12 is adapted for contact with a liquid or gaseous coolant circulating in the fluid flow passage 16, which is sometimes referred to herein as a "coolant flow passage".

Although heat exchanger 10 is described herein as having a specific configuration and function, it will be appreciated that the heat exchangers and manufacturing methods described herein are applicable to other types of heat exchangers which utilize flat plates, including heat-dissipating devices such as heat sinks in which one surface is for contact with an object to be cooled and an opposite surface is in contact with a stagnant or flowing coolant such as air, and which may be provided with cooling fins.

Figure 2:
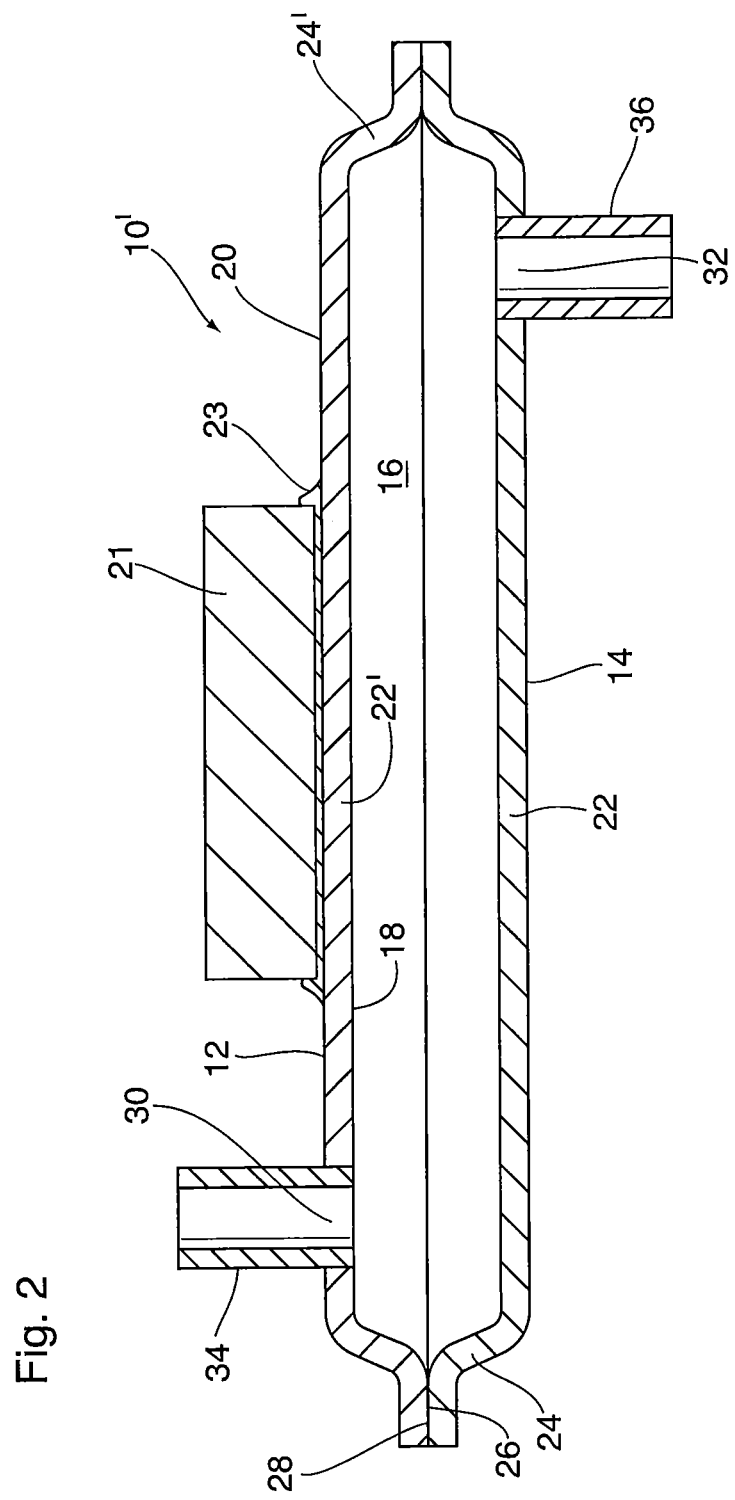
FIG. 2 is a cross-sectional side elevation of a heat exchanger according to an embodiment.
Figure 3:
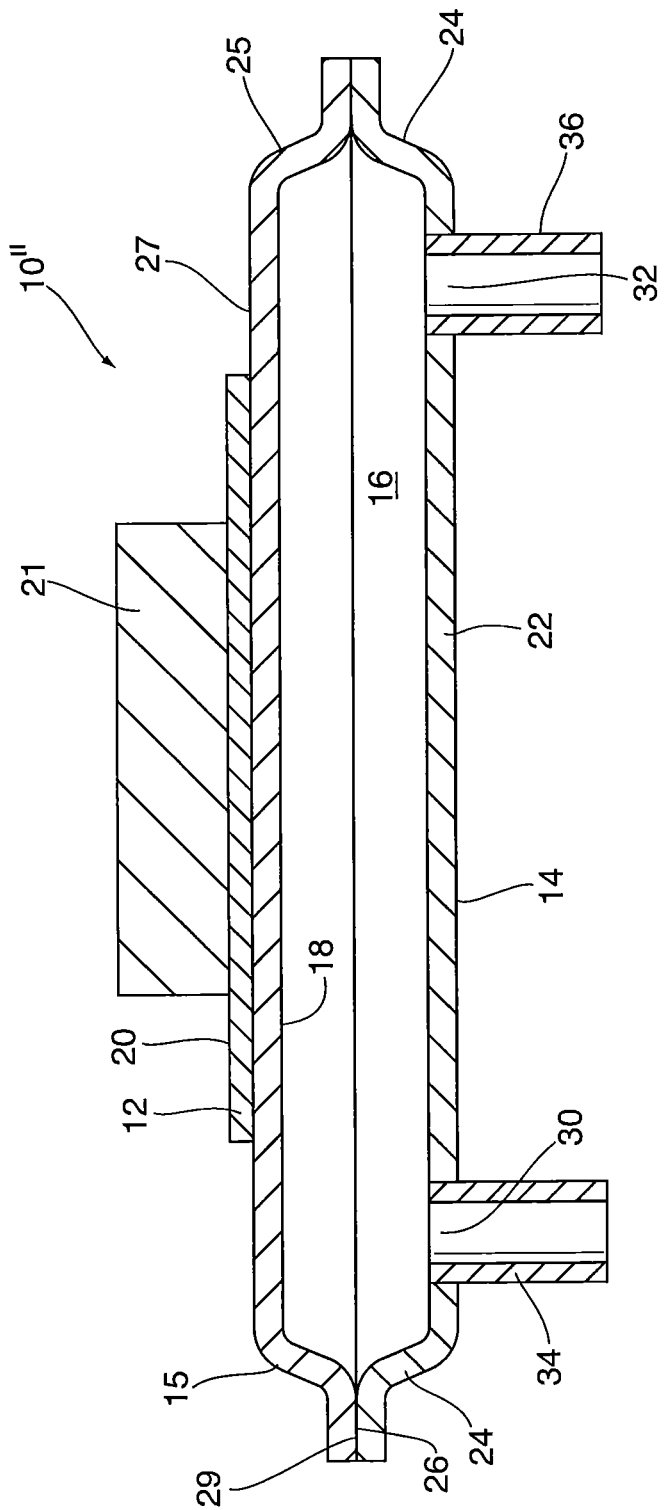
FIG. 3 is a cross-sectional side elevation of a heat exchanger according to an embodiment.

As can be seen from FIG. 1, the first and second surfaces 18, 20 of first plate 12 are substantially flat and planar. Although the entire first plate 12 is shown as being flat and planar, this may not be the case in all embodiments. In some embodiments the first plate 12 may be flat and planar in areas which will be in contact with the object 21 to be cooled, but may be non-planar in other areas. For example, FIG. 2 shows a heat exchanger 10' which is a variant of heat exchanger 10 in which the first plate 12 is a shaped plate formed with a flat, planar base 22' surrounded by a raised peripheral flange 24', similar to that of second plate 14. FIG. 3 shows a heat exchanger 10" which is another variant of heat exchanger 10 in which the first plate 12 comprises a heat sink in the form of a relatively thick, flat plate having its first surface 18 fixed to a surface of a thinner shaped intermediate plate 15 which defines a wall of a fluid-carrying panel, as described in commonly assigned U.S. provisional patent application No. 62/210,542 filed on Aug. 27, 2015, which is incorporated herein by reference in its entirety. In this construction, the first surface 18 of the first plate 12 is in thermal contact with a liquid coolant carried by the fluid-carrying panel through the thinner shaped plate 15, while the second surface 20 of the heat sink 12 is in thermal contact with the object 21 to be cooled. In this embodiment, the second plate 14 has a flat, planar base 22 surrounded on all sides by a raised peripheral flange 24 having a peripheral sealing surface 26, and heat exchanger 10" further comprises an intermediate plate 15 having a peripheral sealing surface 29 and a raised peripheral flange 25 surrounding a flat plate wall 27. The peripheral sealing surface 26 of the second plate 14 is sealed to the peripheral sealing surface 29 of the intermediate plate 15, for example by brazing, with the fluid flow passage 16 being defined between the second plate 14 and the intermediate plate 15. As shown, the first plate 12 is flat and is thicker than the second plate 14 and the intermediate plate 15, and the first surface 18 of the first plate 12 is fixed to the flat plate wall 27 of the intermediate plate 15, for example by brazing. In this embodiment, the first surface 18 of the first plate 12 is separated from the fluid flow passage 16 by the flat plate wall 27 of the intermediate plate 15.

In some embodiments the first and second plates 12, 14 may be comprised of aluminum or alloys thereof, and may be joined together by brazing in a brazing oven. In order to facilitate brazing, a braze filler metal is provided between the surfaces being joined. The braze filler metal may be in the form of a clad layer on the sealing surfaces 26, 28 of the first plate 12 and/or the second plate 14, a shim interposed between sealing surfaces 26, 28, and/or a layer of clad brazing sheet interposed between sealing surfaces 26, 28. Thus, surfaces 26, 28 may not be in direct contact with one another, but rather may be sealed together through a layer of brazing filler metal and/or a brazing sheet, which are not shown in the drawings.

The heat exchanger 10 also has inlet and outlet ports 30, 32 provided with inlet and outlet fittings 34, 36 to connect heat exchanger 10 to other components of a coolant circulation system (not shown). In heat exchanger 10 shown in FIG. 1, the inlet and outlet ports 30, 32 and fittings 34, 36 are provided in the first plate 12, and are located at opposite ends thereof, so that the coolant enters heat exchanger 10 through inlet port 30 and inlet fitting 34, then flows through the length of coolant flow passage 16 and exits the heat exchanger 10 through the outlet port 32 and outlet fitting 36.

Although not shown in the drawings, the coolant flow passage 16 may be provided with a turbulence-enhancing insert such as a corrugated fin or a turbulizer in order to provide increased turbulence and surface area for heat transfer. As used herein, the terms "fin" and "turbulizer" are intended to refer to corrugated turbulence-enhancing inserts having a plurality of axially-extending ridges or crests connected by sidewalls, with the ridges being rounded or flat. As defined herein, a "fin" has continuous ridges whereas a "turbulizer" has ridges which are interrupted along their length, so that axial flow through the turbulizer is tortuous.

Turbulizers are sometimes referred to as offset or lanced strip fins, and example of such turbulizers are described in U.S. Pat. No. Re. 35,890 (So) and U.S. Pat. No. 6,273,183 (So et al.). The patents to So and So et al. are incorporated herein by reference in their entireties.

The object to be cooled 21 has a flat surface to provide intimate thermal contact with the external surface 20 of the first plate 12. Heat produced by the object to be cooled 21 is transferred through the first plate 12 to the coolant circulating through coolant flow passage 16, either directly or through one or more intermediate layers as discussed above.

Although the heat exchanger 10 is shown in the drawings as having a specific configuration wherein the first and second plates 12, 14 are elongate and generally rectangular, and with ports 30, 32 and fittings 34, 36 located in the first plate 12, it will be appreciated that the drawings illustrate only one possible configuration of a heat exchanger within the scope of the invention. It will also be appreciated that the shapes of plates 12, 14 may be varied, and that one or both of the ports 30, 32 and their associated fittings 34, 36 may be located in the second plate 14, as shown in FIGS. 2 and 3. Furthermore, the relative thicknesses of the plates 12 and 14 are not accurately shown to scale in the drawings. In some applications, the first plate 12 may have a thickness which is significantly greater than the thickness of the second plate 14 and/or intermediate plate 15, where one is provided.

The illustrated embodiments show heat exchanger 10 as comprising a single fluid flow passage 16 enclosed by one pair of plates 12, 14 or 12, 15. However, it will be appreciated that heat exchanger 10 may include additional pairs of plates 12, 14 or 12, 15. For example, heat exchanger 10 may include a second pair of plates 12, 14 or 12, 15 provided on top of the object to be cooled 21, and manifolds (not shown) may be provided to connect the coolant flow passages 16 of the two pairs of plates 12, 14. These manifolds may be provided in essentially the same locations that are occupied by fittings 34, 36 in the illustrated embodiment, or they may be provided externally of the plates 12, 14, 15. Heat exchanger structures including multiple pairs of plates are shown in above-mentioned patent applications US 2014/0224452 A1 and U.S. provisional patent application No. 62/210,542 filed on Aug. 27, 2015, the latter disclosing a configuration where the manifolds are provided in a structure which is external to the fluid-carrying panels.

Flatness of the first plate 12 is important for a number of reasons. For example, flatness of the second surface 20 is important to provide intimate thermal contact with the flat surface of the object to be cooled 21, thereby maximizing heat transfer. In addition, it is important for the first surface 18 to be flat, particularly along the peripheral sealing surface 28, so as to ensure that a leak-resistant bond will be formed between the peripheral sealing surface 28 of the first plate 12 and the peripheral sealing surface 26 of the second plate 14. Also, where the first plate 12 comprises a heat sink bonded to an intermediate plate as disclosed in U.S. provisional patent application No. 62/210,542 filed on Aug. 27, 2015, flatness of the first surface 18 is important to ensure that the heat sink is well bonded to the intermediate plate 15. For example, a degree of flatness which will provide adequate contact with the object to be cooled 21 may be ±about 50 microns over a plate length of about 150-200 mm, and is sometimes referred to as "adequate flatness". It will be appreciated that the degree of flatness required for maintaining intimate thermal contact with the object to be cooled 21 is typically greater than the degree of flatness required to provide adequate sealing with first plate 12 or adequate bonding to intermediate plate 15.

The first plate 12 may initially be supplied with adequate flatness, but may be distorted from its flat condition during one or more of the steps involved in manufacturing the heat exchanger 10. This distortion may be caused, for example, by unbalanced or residual stresses in the first plate 12, and may result in bowing or twisting of the plate 12. In some cases, the first plate 12 as initially supplied may be distorted. For example, where the first plate 12 is cut from a continuous sheet of material which is unwound from a coil, the resulting first plate 12 may be distorted due to residual coil set in the material.

The inventors have found that adequate flatness of the first plate 12 can be maintained, restored and/or improved by forming a first surface pattern 40 on the first surface 18 of the first plate 12 (also referred to herein as the "internal surface pattern"), and forming a second surface pattern 42 on the second surface 20 of the first plate 12 (also referred to herein as the "external surface pattern").

The inventors have found that forming the first and second surface patterns 40, 42 on the first plate 12 will result in longitudinal and/or transverse elongation of the first plate 12 along the first surface 18, and a partly or completely offsetting amount of longitudinal and/or transverse elongation of the second surface 20 of first plate 12. Partially offsetting amounts of elongation may be applied in situations where the first plate 12 is initially supplied with inadequate flatness, for example due to residual coil set, in order to improve flatness of first plate 12. Completely offsetting amounts of elongation may be applied in situations where the first plate is initially supplied with adequate flatness, in order to maintain flatness of first plate 12.

In some embodiments, the amount of elongation in the transverse and/or longitudinal dimensions which is produced by formation of the first surface pattern 40 will be substantially the same as the amount of elongation in the transverse and/or longitudinal dimensions which is produced by formation of the second surface pattern 42. In such cases, where the elongation along the first surface 18 substantially corresponds to or offsets the elongation along the second surface 20, the degree of flatness of the first plate 12 prior to formation of the first and second surface patterns 40, 42 will substantially be preserved or maintained. Therefore, an initially flat first plate 12 can be expected to maintain adequate flatness after formation of the first and second surface patterns 40, 42. Also, an initially distorted plate 12 can have its flatness restored and/or improved by the application of first and second surface patterns 40, 42 which may not completely offset one another.

The inventors have also found that where the flatness of the first plate 12 is maintained, restored and/or improved by the formation of first and second surface patterns 40, 42, this flatness will be maintained more easily through the step of brazing plates 12, 14 together. The inventors believe that this may be due to the balancing of stresses in the plate 12 resulting from the application of surface patterns 40, 42, thereby reducing residual stresses which may result in distortion during the braze cycle.

The inventors have found that it is advantageous to form the first surface pattern 40 and the second surface pattern 42 simultaneously, so as to provide stress symmetry and avoid any bending of the first plate 12 caused by one-sided pattern formation, and thereby maintain the first plate 12 in an adequately flat condition throughout the forming process. However, it will be appreciated that the first and second surface patterns 40, 42 may instead be formed sequentially, such that any bending of the first plate 12 caused by application of one of the surface patterns 40 or 42 will be corrected by the sequential formation of the other surface pattern 40 or 42.

Figure 4:
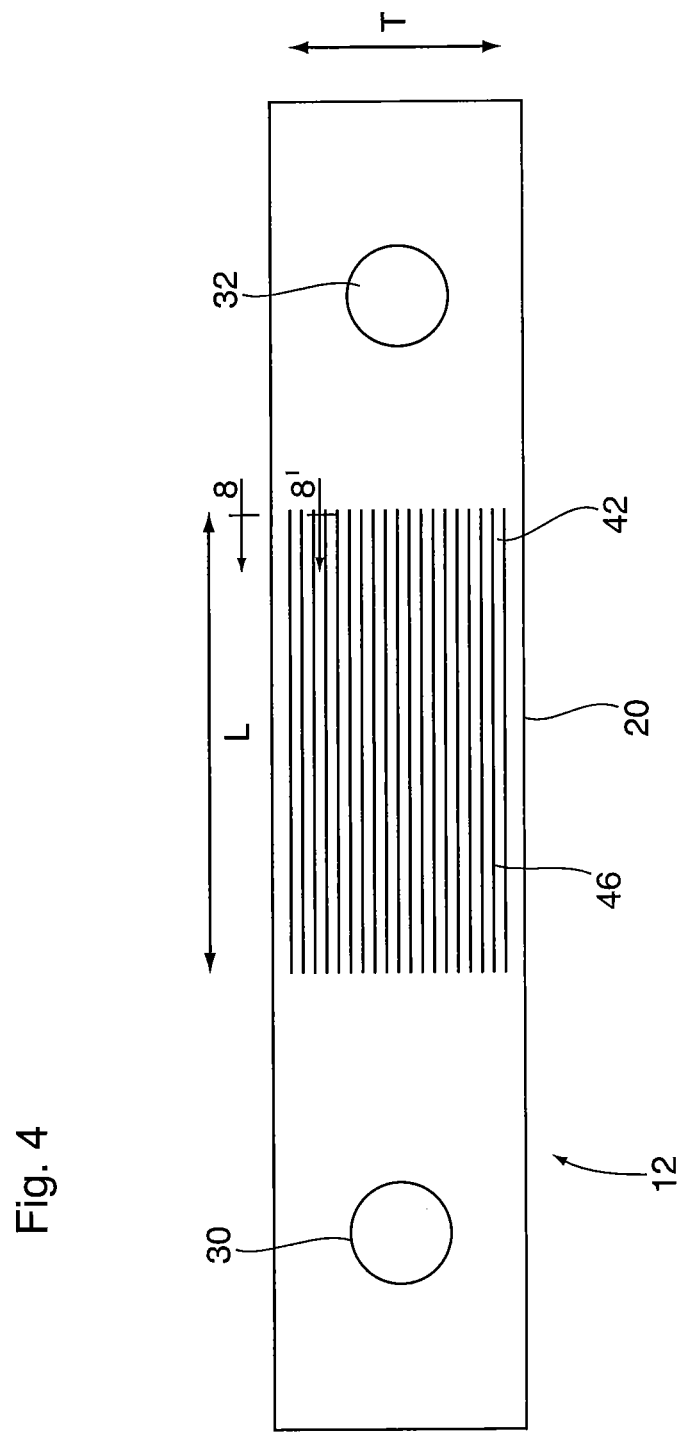
FIG. 4 is a plan view of the first plate of the heat exchanger of FIG. 1, showing the second surface pattern.
Figure 5:
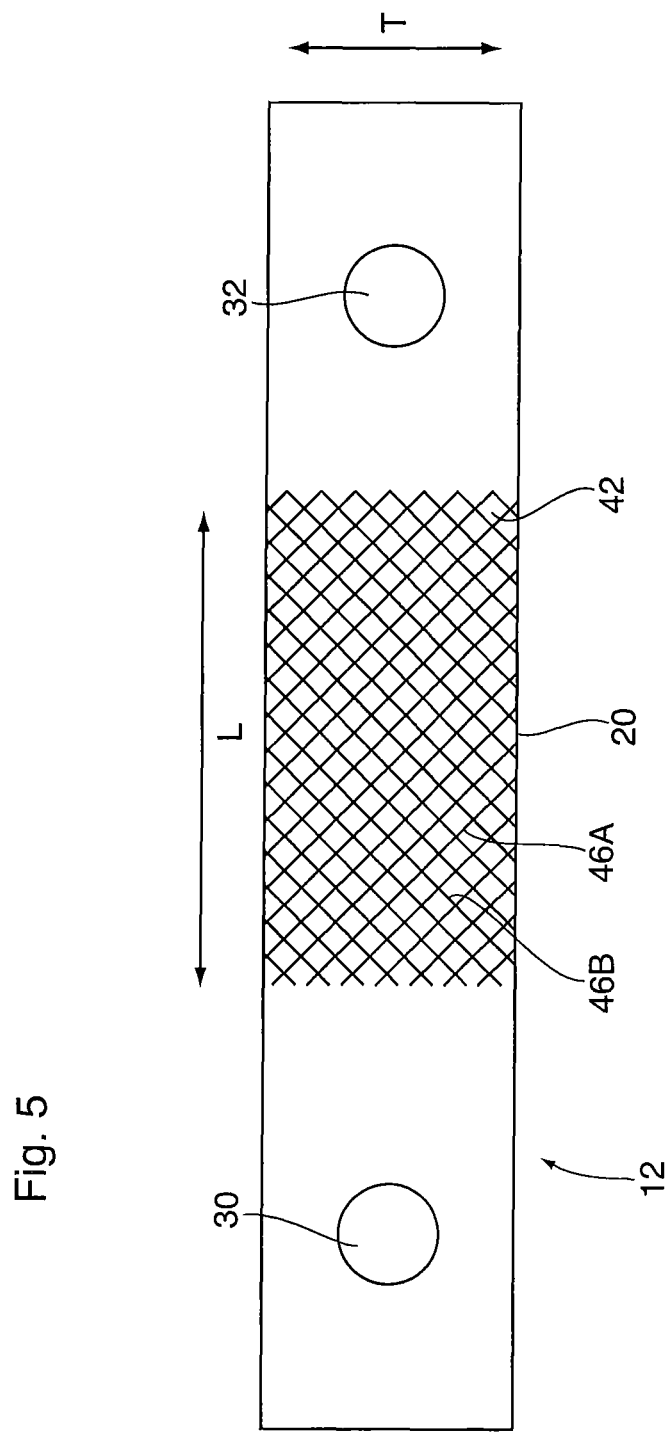
FIG. 5 is a plan view of the first plate with an alternate second surface pattern.

FIGS. 4 and 5 are plan views of the second surface 20 of first plate 12, showing the second surface pattern 42, which may be provided throughout the entire area of second surface 20 or in portions thereof. In FIG. 4, the second surface pattern 42 comprises a plurality of longitudinally extending, parallel grooves 46, wherein the longitudinal dimension of first plate 12 is identified in FIG. 4 by arrow L, and the transverse dimension is identified by arrow T. In FIG. 5, the second surface pattern 42 comprises a first plurality of parallel grooves 46A which are oriented at about 45 degrees to the longitudinal edges of the first plate 12, and a second plurality of parallel grooves 46B which are oriented at about 45 degrees to the longitudinal edges of the first plate 12, and which criss-cross the first plurality of grooves 46A at an angle of about 90 degrees. In other words, the second surface pattern has the appearance of a "knurled" surface pattern. It will be appreciated that the angle of intersection of the first and second pluralities of grooves 46A, 46B is variable, and may be from about 30 to about 90 degrees. Also, as shown in FIGS. 4 and 5, the external surface pattern 42 may be provided only in those areas of the second surface 20 which will be in contact with the object to be cooled 21.

Figure 6:
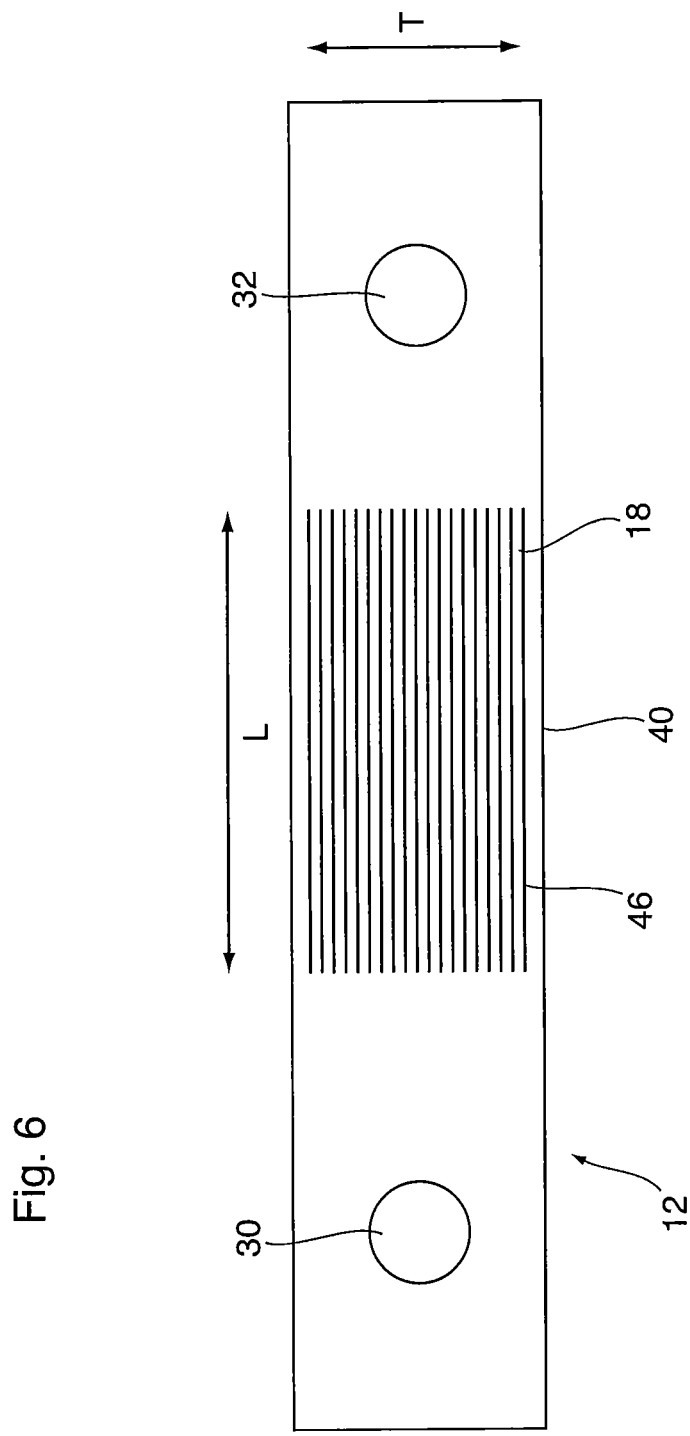
FIG. 6 is a plan view of the first plate, showing the first surface pattern.
Figure 7:
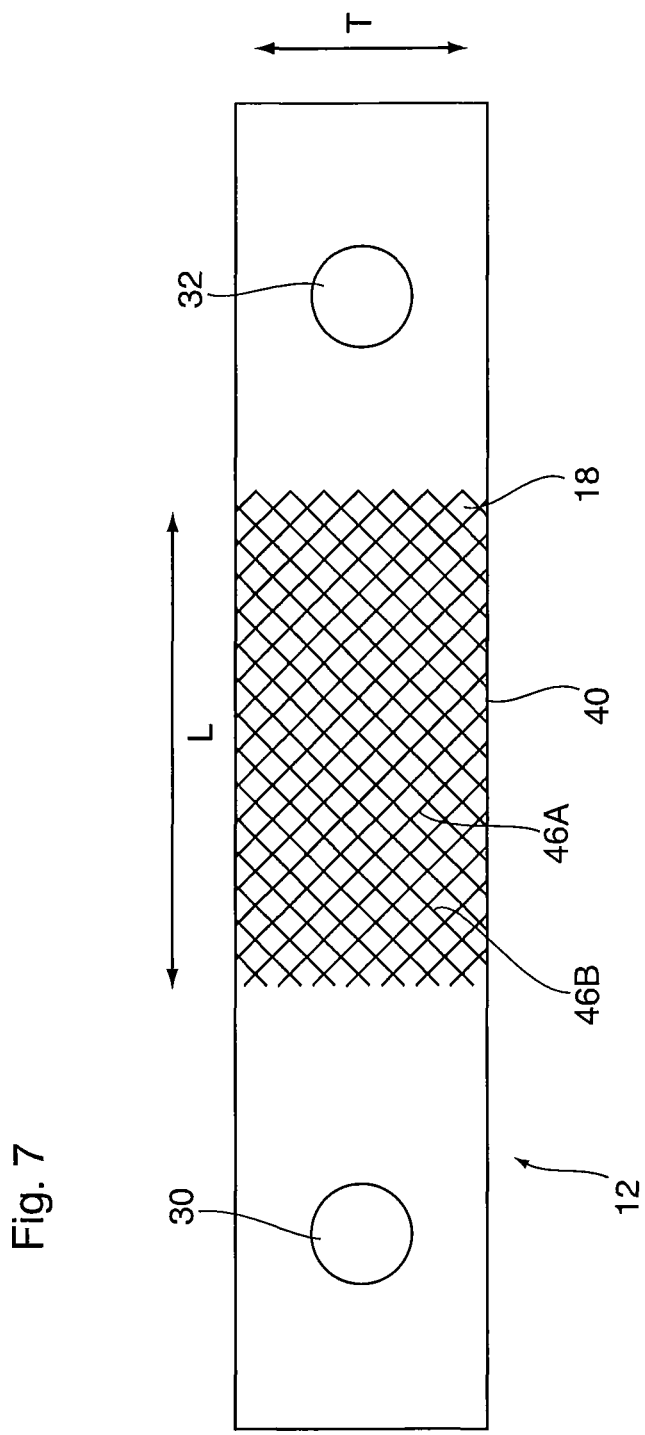
FIG. 7 is a plan view of the first plate with an alternate first surface pattern.

Similarly, FIGS. 6 and 7 are plan views of the first surface 18 of first plate 12, showing the first surface pattern 40, which may be provided throughout the entire area of first surface 18 or in portions thereof. In FIG. 6, the first surface pattern 40 comprises a plurality of longitudinally extending, parallel grooves 46 and may be identical to the second surface pattern 42. In FIG. 7, the first surface pattern 40 has an appearance similar to a "knurled" surface pattern, and which may be identical to the second surface pattern 42 shown in FIG. 5.

The first and second surface patterns 40, 42 each comprise a plurality of grooves 46 which extend below non-patterned portions of the respective first and second surfaces 18, 20. Each of the grooves 46 is elongate, having a base 48 located below the first or second surface 18, 20, and a pair of opposed upper edges 49 which are substantially flush with the first or second surface 18, 20 surrounding the groove 46. For example, as shown in FIG. 8 and the close-up of FIG. 9, the grooves 46 may be V-shaped with sloped sides. However, it will be appreciated that the grooves 46 are not required to be V-shaped, and that the bases 48 of grooves 46 may instead be flat (FIG. 10) or rounded (FIG. 11) and the sides of grooves 46 may be sloped or vertical. The shapes of the grooves 46 is somewhat dependent on the structure and function of the plate 12 to which they are applied, since the grooves 46 may serve a function in the heat exchanger. In some embodiments, the grooves 46 may be formed by one or more stamping or rolling operations with a die or roller.

Figure 12:
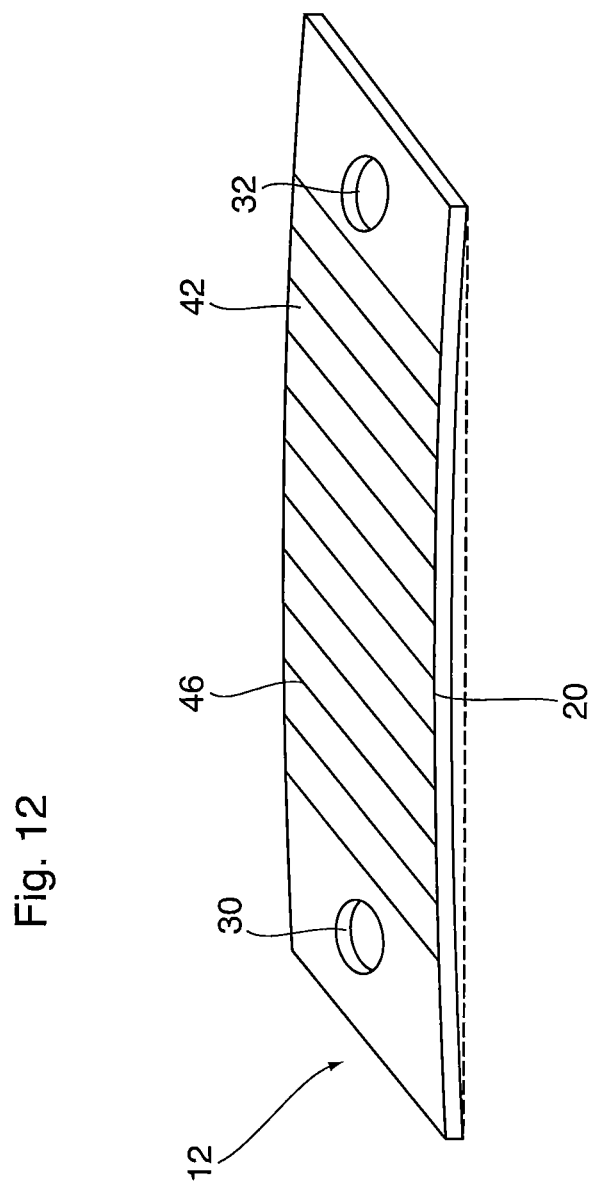
FIG. 12 is a top perspective view of a bowed plate with a surface pattern applied to its second surface only.
Figure 13:
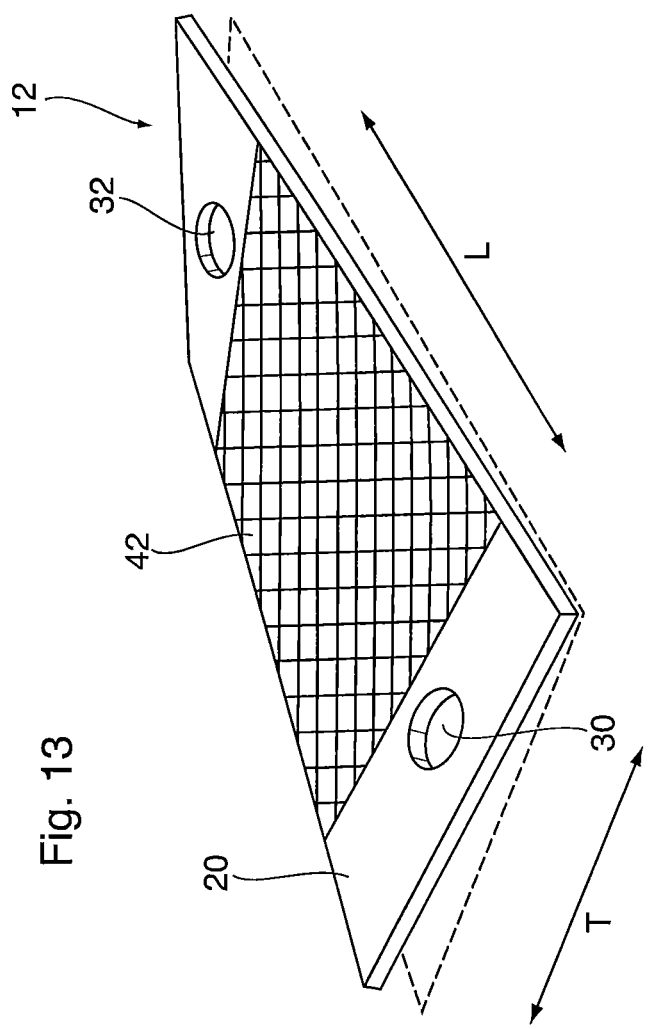
FIG. 13 is a front perspective view of a twisted plate with a surface pattern applied to its second surface only.

Referring now to FIGS. 12 and 13, the inventors have found that the step of applying a surface pattern 40 or 42 to only one of the first or second surface 18 or 20 causes elongation of the surface 18 or 20 of the first plate 12 along one or both of the longitudinal (L) and transverse (T) dimensions of the first plate 12, depending on the direction of grooves 46, wherein dimensions L and T are shown in the plan views of FIGS. 4 to 7. The inventors have further found that elongation of the one of surfaces 18, 20 relative to the other surface 18, 20 can result in deformation of the first plate 12, such as bowing along the longitudinal dimension L or transverse dimension T, and/or twisting of the plate 12 diagonally. FIGS. 12 and 13 illustrate, in an exaggerated manner, how bowing and twisting can affect the flatness of plate 12, with the dotted lines in FIGS. 12 and 13 showing edges of a first plate 12 which is perfectly flat. Twisting occurs where there is elongation in both the longitudinal and transverse dimensions, which may result when the surface pattern 40 or 42 comprises criss-crossing grooves 46 as in FIG. 13. FIG. 12 shows an embodiment where the grooves 46 extend transversely.

As explained above, deformation of the first plate 12 caused by formation of a surface pattern 40 or 42 on only one side 18 or 20 of first plate 12 may have an adverse effect on heat transfer by reducing the ability of the second surface 20 of first plate 12 to maintain intimate thermal contact with the object to be cooled 21, and may have an adverse effect on sealing by reducing the ability of the first surface 18 of first plate 12 to bond to the second plate 14 or intermediate plate 15. The inventors have also found that once the first plate 12 is deformed by formation of a surface pattern 40 or 42 on only one side, it can be difficult to restore adequate flatness of the first plate 12 prior to, during or after the first plate 12 is brazed or otherwise sealed to the second plate 14 or intermediate plate 15.

It is important to note that the first and second surface patterns 40, 42 are formed only in the surfaces 18, 20 of the first plate 12. Surface patterns 40, 42 are distinct from features such as ribs, dimples, raised flanges, raised openings etc. which generally extend through the thickness of a plate such that they are visible from both sides of the plate, and which generally have a height which is at least as great as the thickness of the plate in which they are formed. In contrast, the first and second surface patterns 40, 42 each have a depth D defined between the bases 48 of grooves 46 and the upper edges 49, and/or the surrounding surface 18 or 20 of first plate 12, wherein depth D is less than a thickness of the first plate 12. Accordingly, the surface pattern 40 or 42 formed on one surface 18 or 20 of first plate 12 is not visible on the opposite side of the first plate 12.

Typically, the combined depths D of the first and second surface patterns 40, 42 (i.e. D of pattern 40 plus D of pattern 42) is less than about 50 percent of the thickness of the first plate 12. In specific embodiments, each of the first and second surface patterns 40, 42 may have a depth D from about 0.05 mm to about 0.50 mm, while the thickness of the first plate 12 is typically about 0.5 to about 2.5 mm. It will be appreciated that the depths D of surface patterns 40, 42 are typically lower where the thickness of the first plate 12 is at the thinner end of this range, and higher where the thickness of the first plate 12 as at the thicker end of this range.

As mentioned above, the first and second surface patterns 40, 42 are selected such that the elongation of the first plate 12 along the first surface 18 produced by application of the first surface pattern 40 is substantially the same as the elongation of the first plate 12 along its second surface 20 produced by application of the second surface pattern 42. In other words, as already mentioned above, the amount of elongation along the first surface 18 is substantially the same as (i.e. corresponds to or offsets) the elongation along the second surface 20, such that flatness of the first plate 12 is maintained and/or improved after formation of the surface patterns 40, 42. The inventors have found that flatness can be maintained and/or improved by applying surface patterns 40, 42 on the first and second surfaces 18, 20 such that the stresses created by the application of patterns 40, 42 are substantially symmetrical.

In order to produce a corresponding amount of elongation and stress symmetry, the surface patterns 40, 42 applied to the first and second surfaces 18, 20 of first plate 12 may be of substantially the same surface area, located in the same areas of plate 12, and/or may have grooves 46 with the same shape, depth, pitch and/or direction(s). As used herein, the term "pitch" refers to the distance between the bases 48 of adjacent grooves 46.

For example, symmetrical stresses and corresponding amounts of elongation may be created where the surface patterns 40, 42 are identical to one another, and/or mirror images of one another. This can be seen by comparing FIGS. 4 and 6 and FIGS. 5 and 7, in which the surface patterns 40, 42 are identical and are provided over the same areas of the first and second surfaces of the first plate 12. However, in some circumstances, it may not be possible or desirable to provide the identical surface patterns 40, 42 on the first and second surfaces 18, 20 of first plate 12, and/or to provide them over exactly the same areas of the first and second surfaces 18, 20. In these circumstances, it is possible to vary one or more of the above parameters in the first and second surface patterns 40, 42, while maintaining the desired offset of elongation forces and provide stress symmetry in the first and second surfaces 18, 20, so as to maintain and/or improve flatness of first plate 12.

Figure 17:
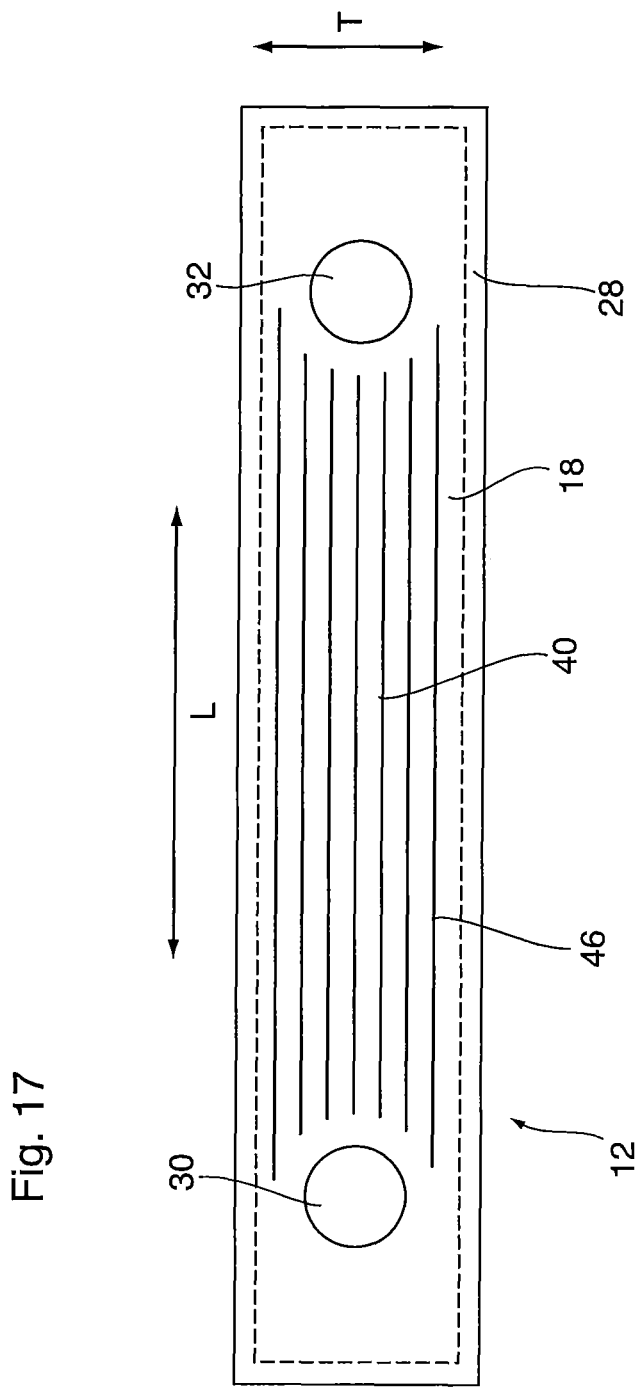
FIGS. 17 and 18 each show a plan view of the first plate, showing a first surface pattern which is an alternative to that shown in FIG. 6.
Figure 18:
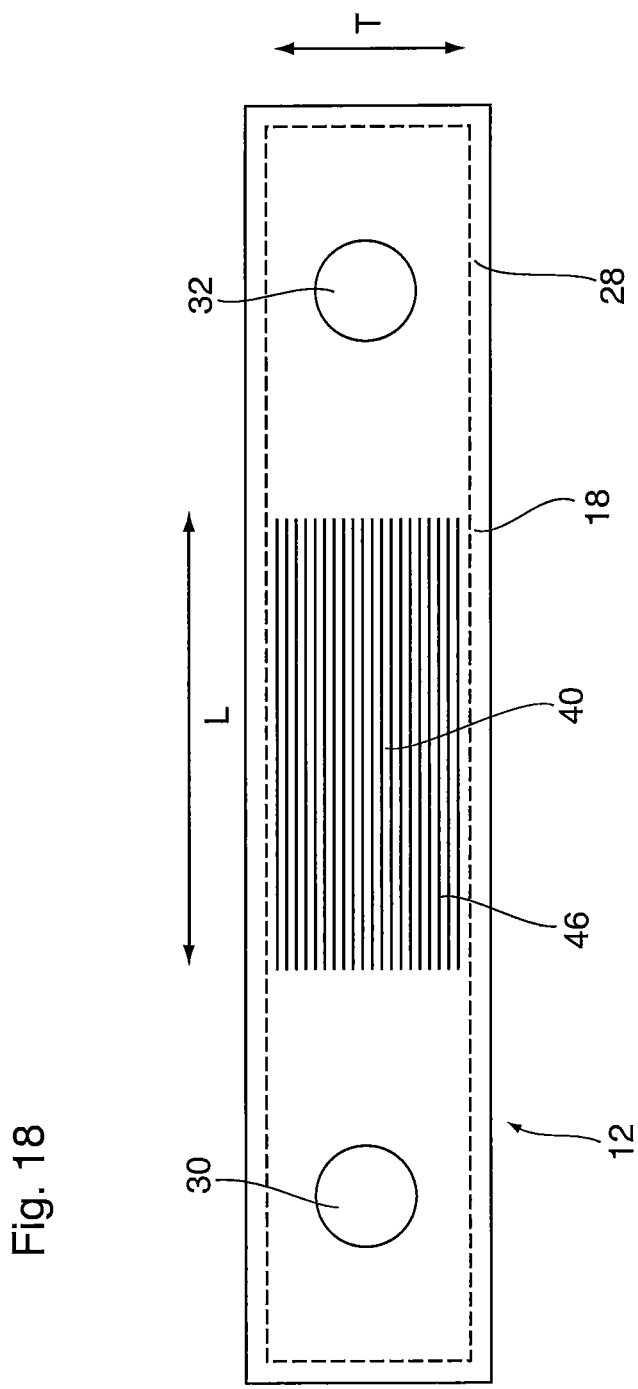

As an example, it may be desired to apply the second surface pattern 42 only in areas of the second surface 20 which will be in contact with the object to be cooled 21, as shown in FIGS. 4 and 5. Instead of simply applying the first surface pattern 40 to the same area of the first surface (as in FIGS. 6 and 7), it may be desired to provide the first surface pattern 40 over a larger or smaller area of first surface 18. This is now explained in more detail with reference to FIGS. 17 and 18, showing alternate configurations of the first surface 18 of first plate 12 illustrated in FIG. 6, with the second surface 20 being as shown in FIG. 4. FIG. 17 shows a configuration in which the first surface pattern 40 consists of more widely spaced longitudinal grooves 46 provided over a greater area than the area of the second surface pattern 42. In FIG. 18, the first surface pattern 40 may be provided in a smaller area of the first surface 18. In both FIGS. 17 and 18, the first surface pattern 40 is not provided in areas of first surface 18 which comprise the peripheral sealing surface 28, which is outlined with a dotted line in FIGS. 17 and 18. In these embodiments, the peripheral sealing surface 28 is smooth and free of any surface patterning in order to enhance sealing. To maintain adequate flatness while permitting these and other variations in the surface patterns 40, 42, it may be necessary to vary one or more of the other parameters so as to maintain the offset of elongation forces and to provide stress symmetry along the first and second surfaces 18 and 20.

As an example, in some embodiments, the first surface pattern 40 may have grooves 46 with a depth which is ½ the depth of the grooves 46 of second surface pattern 42. In such a configuration, offsetting elongation forces and stress symmetry can be maintained by providing the first surface pattern 40 with four times the density as second surface pattern 42, i.e. the first surface pattern 40 would have a pitch which is ¼ the pitch of second surface pattern 42.

In some embodiments, stress symmetry may be provided by forming at least some of the grooves 46 of the first surface pattern 40 and at least some of the grooves of the second surface pattern 42 in direct opposition to one another. In other embodiments, substantially all of the grooves 46 of the first and second surface patterns 40, 42 may be in direct opposition to one another, such that the first and second surface patterns 40, 42 are identical and/or mirror images of each other.

In some embodiments, at least some of the grooves 46 of the first and second surface patterns 40, 42 may have the same depth and width, and/or the first and second surface patterns 40, 42 may be of substantially the same pitch, whether or not the grooves 46 of surface patterns 40, 42 are directly opposed to one another.

In some embodiments the first and second surface patterns 40, 42 may comprise substantially straight grooves 46. For example all the grooves 46 of the first and second surface patterns 40, 42 may be straight and parallel to one another, and may be parallel to the grooves 46 on the opposite side 18 or 20 of the first plate 12. In other embodiments, at least some of the grooves 46 of surface patterns 40 and/or 42 may be curved. Examples of alternate surface patterns 40, 42 comprised of straight and/or curved grooves 46 are now described below with reference to FIGS. 19 to 25.

As an alternative to the surface patterns 40, 42 comprising longitudinally extending straight grooves 46 shown in FIGS. 4 and 6, FIG. 19 shows a surface pattern 40, 42 comprising a plurality of straight, parallel grooves 46 extending transversely between the longitudinal edges of the first plate.

FIG. 20 illustrates a surface pattern 40, 42 comprising a first plurality of straight parallel grooves 46A which are oriented at about 90 degrees to the longitudinal edges of the first plate 12, and a second plurality of straight, parallel grooves 46B which substantially parallel to the longitudinal edges of the first plate 12, and which criss-cross the first plurality of grooves 46A at an angle of about 90 degrees. This surface pattern 40, 42 has the appearance of a "knurled" surface pattern, similar to that shown in FIGS. 5 and 7.

FIG. 21 illustrates an example of a surface pattern 40, 42 which is entirely made up of curved grooves 46. The grooves 46 are in the shape of partial or complete overlapping ellipses or ovals which are elongated in the transverse dimension of first plate 12. FIG. 22 illustrates an example of a surface pattern 40, 42 which is entirely made up of pairs of overlapping, longitudinally extending sinusoidal grooves 46A and 46B, wherein each pair of sinusoidal grooves 46A, 46B are out of phase with one another and, in the illustrated example, have a phase difference of about 180 degrees.

FIG. 23 illustrates an example of a surface pattern 40, 42 which is similar to that shown in FIG. 22 in that it is entirely made up of pairs of overlapping sinusoidal grooves 46A and 46B. As in FIG. 22, each pair of sinusoidal grooves 46A, 46B are out of phase with one another by about 180 degrees. FIG. 23 differs from FIG. 22 in that the sinusoidal grooves 46A, 46B in FIG. 23 extend transversely rather than longitudinally.

FIG. 24 illustrates an example of a surface pattern 40, 42 which is similar to the knurled surface pattern of FIG. 20, except that the surface pattern 40, 42 of FIG. 24 comprises curved grooves 46A, 46B having an undulating, sinusoidal shape rather than being straight as in FIG. 20.

Figure 25:
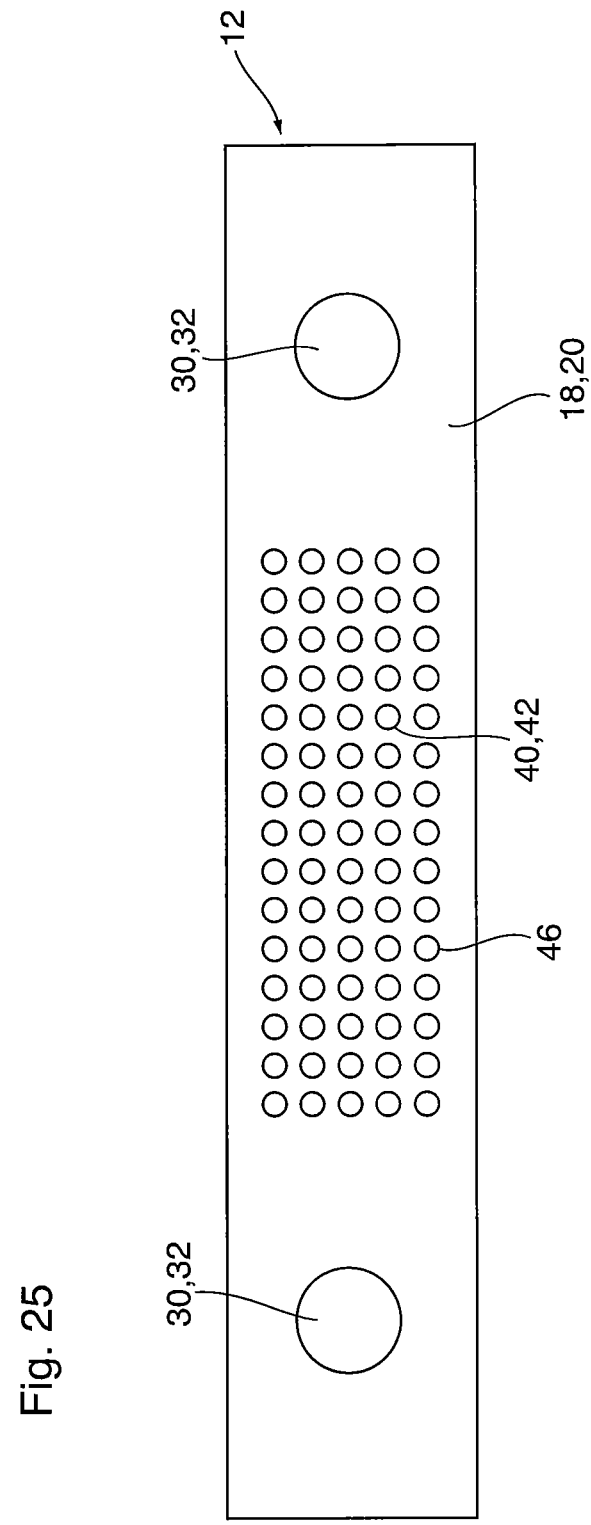

FIG. 25 illustrates an example of a surface pattern 40, 42 which is comprised of a plurality of small, spaced apart, circular grooves 46 which are arranged in a grid pattern.

It will be appreciated that the surface patterns 40, 42 shown and described herein are examples only, and illustrate that numerous variations in the surface patterns 40, 42 are within the scope of the present invention. Although each of the exemplary surface patterns 40, 42 is shown as comprising only straight or curved grooves 46, it will be appreciated that the surface patterns 40, 42 may comprise combinations of one or more of the grooves 46 shown and/or described herein, including combinations of straight grooves 46 and curved grooves 46.

FIG. 15 illustrates how the first and second surface patterns 40, 42 may be formed in the method for manufacturing heat exchanger 10. As shown, a blank first plate 12A is placed between a pair of stamping dies 60, 62, and the first and second surface patterns 40, 42 (their locations being shown in dotted lines in FIG. 15) are formed by pressing the first plate 12 between the dies 60, 62. The dies 60, 62 have ridges 64 protruding from a flat surface 66, wherein the ridges 64 form the grooves 46 when the blank plate 12A is pressed between dies 60, 62.

The force applied to the first surface 18 by stamping die 62 is directly opposed to a second force applied to the second surface 20 by stamping die 60, wherein the directions of the forces applied by stamping dies 60, 62 are indicated by arrows in FIG. 15. The forces applied to the first and second surfaces 18, 20 by stamping dies 60, 62 may be substantially opposite and equal to one another in order to provide stress symmetry and enhance flatness of first plate 12.

FIG. 15 illustrates a first plate 12 and a manufacturing method in which the first and second surface patterns 40, 42 comprise a plurality of parallel, non-overlapping straight grooves 46 which are applied by stamping dies 60, 62, each having a plurality of non-overlapping, straight, parallel ridges 64. However, it will be appreciated that one or both of the first and second surface patterns 40, 42 applied in accordance with the method illustrated in FIG. 15 may have any of the surface patterns 40, 42 described herein having straight or curved grooves 46, or combinations of straight and curved grooves 46, including those illustrated in FIGS. 4, 6, 12, 17-19 and 25. Where the surface patterns 40, 42 are formed with curved grooves 46, the stamping dies 60, 62 will include correspondingly curved ridges 64.

As will now be explained with reference to FIGS. 16A to 16D, the first surface pattern 40 may instead comprise a first group of grooves 46A (also referred to herein as a plurality of "first grooves") and a second group of grooves 46B (also referred to herein as a plurality of "second grooves"), wherein the first and second groups of grooves 46A, 46B overlap one another, and may optionally be provided over the same portions of the first surface 18. Similarly, the second surface pattern 42 may comprise first and second groups of grooves 46A, 46B which overlap one another, and may optionally be provided over the same portions of the second surface 20.

The first and second groups of grooves 46A, 46B of the first and second surface patterns 40, 42 may intersect one another at an angle. The angle of intersection of the first and second pluralities of grooves 46 is variable, and may be from about 30 to about 90 degrees.

Although not essential, the grooves 46A, 46B within each of the first and second groups may be substantially straight and/or may be parallel to one another. Also, the first group of grooves 46A of the first surface pattern 40 may be parallel to the first group of grooves 46A of the second surface pattern 42, and the second group of grooves 46B of the first surface pattern 40 may likewise be parallel to the second group of grooves 46B of the second surface pattern 42.

Where the surface patterns 40, 42 include first and second groups of intersecting grooves 46A, 46B, it will be appreciated that the step of forming each of the first and second surface patterns 40, 42 will comprise the following sub-steps: (i) forming the first group of grooves 46A; followed by (ii) forming the second group of grooves 46B.

FIG. 16A illustrates the first sub-step of forming the first group of grooves 46A on the first surface 18 of blank flat plate 12A and the first sub-step of forming the first group of grooves 46A on the second surface 20. As shown in FIG. 16A, these sub-steps may be performed simultaneously by pressing the blank flat plate 12A between a pair of stamping dies 60, 62 as described above, having a plurality of raised ridges 64 protruding from flat surface 66. The first group of grooves 46A are formed by this pressing operation, and the resulting intermediate plate 12B is shown in FIG. 16B. Although not essential, the first group of grooves 46A may extend diagonally relative to the edges of the plate 12B.

The next sub-step of forming the second group of grooves 46B on the first surface 18 may be performed simultaneously with the sub-step of forming the second group of grooves 46B on the second surface 20, as shown in FIG. 16C. In this way, the method permits stress symmetry to be provided in cases where the first and second surface patterns 40, 42 are each formed in multiple steps. The finished first plate 12 is shown in FIG. 16D, having first and second surface patterns 40, 42 each comprising a pattern of intersecting grooves 46A and 46B, wherein the angle of intersection is about 90 degrees.

Although the above description mentions that the sub-steps of forming the first and second groups of grooves 46A, 46A are simultaneously performed on the first and second surfaces 18, 20, it will be appreciated that one or both of the sub-steps of forming the first and second groups of grooves 46A, 46A may be performed sequentially on the first and second surfaces 18, 20. Therefore, any bending of the first plate 12 caused by formation of the first or second group of grooves 46A or 46B on one of the surfaces 18 or 20 will be corrected by the sequential formation of the first or second group of grooves 46A or 46B on the opposite surface 18 or 20.

FIGS. 16A-D illustrate a manufacturing method in which the first and second surface patterns 40, 42 applied to first plate 12 each comprise a plurality of overlapping or intersecting straight grooves 46 which are applied in two stamping operations by stamping dies 60, 62, wherein each stamping die 60, 62 has a plurality of non-overlapping, straight, parallel ridges 64. However, it will be appreciated that one or both of the first and second surface patterns 40, 42 applied in accordance with the method illustrated in FIGS. 16A-D may have any of the surface patterns 40, 42 described herein having overlapping or intersecting straight or curved grooves 46, or combinations of straight and curved grooves 46, including those illustrated in FIGS. 5, 7, 13 and 20-24. Where the surface patterns 40, 42 are formed with curved grooves 46, the stamping dies 60, 62 will include correspondingly curved ridges 64.

In some embodiments, the grooved surface patterns 40, 42 may include ridges which are raised above the surfaces 18 and 20 of first plate 12, these ridges comprising material of the first plate 12 which is displaced during formation of surface patterns 40, 42. In this regard, dotted lines 51 in FIG. 9 represent raised ridges. It will be appreciated that the formation of raised ridges will effectively increase the depths of the surface patterns 40, 42, since the upper edges 49 of grooves 46 in such a pattern will extend to the tops of the raised ridges, rather than being flush with the level of the first or second surface 18 or 20.

Raised ridges may be provided in applications where it is desirable to increase surface friction or aesthetic quality. However, in the applications relating to the invention, the inventors have found that minimizing the formation of ridges has benefits on both the first and second surfaces 18, 20 of first plate 12. For example, minimizing the formation of raised ridges on the second surface 20 of first plate 12 may help to improve heat transfer between the object to be cooled 21 and the second surface 20 of first plate 12. In this regard, the existence of raised ridges 51 as shown in FIG. 9 would cause the flat bottom surface of the object 21 to be cooled to be spaced apart from the second surface 20 of first plate 12, reducing thermal contact between the object 21 and the second surface 20, and thereby having a negative impact on heat transfer between the object 21 and the coolant in fluid flow passage 16.

Similarly, it will be appreciated that the existence of raised ridges 51 on the first surface 18 of first plate 12 can have a negative impact on sealing between the first plate 12 and an adjacent second plate 14 or intermediate plate 15. Therefore, minimizing the formation of raised ridges 51 on the first surface 18 of first plate 12 can result in improved sealing with second plate 14 or intermediate plate 15, particularly in cases where the first surface pattern 40 extends into the peripheral sealing surface 28 of first plate 12, in which case the braze filler metal must fill the grooves 46 in order to ensure an adequate seal between plates 12 and 14. Minimizing the formation of raised ridges 51 in the sealing surface 28 will minimize the gap between the sealing surfaces 26, 28 which the molten braze filler metal will need to bridge by capillary action, while increasing the availability of braze filler metal to fill the grooves 46, thereby achieving a more robust braze, reducing the amount of braze filler metal consumed, and increasing the amount of void-free braze filler metal to fill the joint between the plates 12, 14.

The use of stamping dies 60, 62 as described above, having a fine pattern of ridges 64 protruding from a flat surface 66, will minimize the formation of ridges 51 in the internal and external surface patterns 40, 42. In this regard, the ridges 64 of dies 60, 62 have a height corresponding to the desired depth D of the grooves 46 below the surface 18 or 20 of first plate 12. Therefore, as the plate 12 is pressed between dies, the flat surfaces 66 of dies 60, 62 will bottom out against the internal and external surfaces 18, 20 of first plate 12, and prevent the formation of ridges 51 protruding above the surfaces 18, 20 of plate 12.

Substantially "ridgeless" surface patterns 40, 42 are shown in FIGS. 8-11, 14, 16B and 16D.

In some embodiments, the peripheral sealing surface 28 on the first surface 18 of first plate 12 may be smooth and flat, and free of the first surface pattern 40. Accordingly, in these embodiments, the first surface pattern 40 may terminate at a distance from the peripheral edges of the first surface 18, so as to preserve the smoothness of the sealing surface 28. This has been described above with reference to FIGS. 17 and 18.

Although the invention has been described in connection with certain embodiments, it is not limited thereto. Rather, the invention includes all embodiments which may fall within the scope of the following claims.

What is claimed is:

1. A heat exchanger comprising a thermally conductive first plate having a first surface which is flat and adapted for thermal contact with a heat transfer fluid, and a second surface which is flat and adapted for thermal contact with a solid, flat surface of an object to be heated or cooled, wherein the first surface of the first plate is opposite the second surface of the first plate, wherein the first surface and the second surface are outer surfaces of the first plate;

wherein the heat exchanger comprises an inlet port, an outlet port, and at least one fluid flow passage for flow of a heat transfer fluid between the inlet port and the outlet port;

wherein the first surface is provided with a first surface pattern comprising a plurality of first grooves formed into the first surface, each of the first grooves having a base located below the first surface;

wherein the second surface is provided with a second surface pattern comprising a plurality of second grooves formed into the second surface, each of the second grooves having a base;

wherein each of the plurality of first grooves comprising the first surface pattern are in directly opposed alignment with each of the plurality of second grooves comprising the second surface pattern; and wherein the second surface is an external surface of the heat exchanger, and is located outside any of the at least one fluid flow passages of the heat exchanger;

wherein the heat exchanger further comprises a second plate having a peripheral sealing surface, and the first surface of the first plate has a peripheral sealing surface; and wherein the peripheral sealing surface of the first plate is sealed to the peripheral sealing surface of the second plate, with one said fluid flow passage being defined between the second plate and the first surface of the first plate; and wherein the first surface of the first plate is flat and planar, such that the peripheral sealing surface of the first plate is co-planar with other portions of the first surface of the first plate, including a portion of the first surface in which the first surface pattern is provided.

2. The heat exchanger of claim 1, wherein the first surface pattern has a depth defined by a depth of the first grooves, wherein the second surface pattern has a depth defined by a depth of the second grooves, and wherein a combined depth of the first and second surface patterns is less than 50 percent of a thickness of the thermally conductive first plate.

3. The heat exchanger of claim 2, wherein the depth of each of the first and second surface patterns is from 0.05 to 0.50 mm.

4. The heat exchanger of claim 2, wherein the depth of each of the first grooves is defined between the base of said first groove and the first surface of the first plate; and/or the depth of each of the second grooves is defined between the base of said second groove and the second surface of the first plate; and wherein each of the first grooves has a pair of opposed upper edges which are substantially flush with the first surface, and/or each of the second grooves has a pair of opposed upper edges which are substantially flush with the second surface.

5. The heat exchanger of claim 1, wherein the first and second surface patterns have one or more parameters which are the same, wherein the parameters are selected from one or more of: surface area of pattern, location of pattern on plate, shape of grooves, depth of grooves, pitch of grooves, and direction(s) of grooves.

6. The heat exchanger of claim 1, wherein the plurality of first grooves comprising the first surface pattern comprises a first group of said first grooves and a second group of said first grooves, wherein the first grooves within each of the first and second groups are straight and parallel to one another, and wherein the first grooves of the first and second groups are angled relative to one another and criss-cross one another at an angle from 30 to 90 degrees; and/or wherein the plurality of second grooves comprising the second surface pattern comprises a first group of said second grooves and a second group of said second grooves, wherein the second grooves within each of the first and second groups are straight and parallel to one another, and wherein the second grooves of the first and second groups are angled relative to one another and criss-cross one another at an angle from 30 to 90 degrees.

7. The heat exchanger of claim 1, wherein the first plate has an outer peripheral edge;
wherein the peripheral sealing surface of the first plate extends along the outer peripheral edge; and
wherein the peripheral sealing surface of the first plate is smooth, flat and free of said first surface pattern.

8. The heat exchanger of claim 1, wherein at least some of the first grooves and the second grooves which are directly opposed to one another have one or more of the same depth, the same width, and the same pitch.

9. The heat exchanger of claim 1, wherein the first grooves are straight and parallel to one another and the second grooves are straight and parallel to one another.

10. The heat exchanger of claim 1, wherein the first surface pattern comprises a first group of said first grooves and a second group of said first grooves, wherein the first and second groups of said first grooves overlap one another; and/or
wherein the second surface pattern comprises a first group of said second grooves and a second group of said second grooves, wherein the first and second groups of said second grooves overlap one another.

11. The heat exchanger of claim 10, wherein the first and second groups of said first grooves intersect one another at an angle; and/or the first and second groups of said second grooves intersect one another at an angle.

12. The heat exchanger of claim 1, wherein at least some of the grooves of the first surface pattern and/or at least some of the grooves of the second surface pattern are curved.

13. The heat exchanger of claim 1, wherein each of the first grooves of the first surface pattern and each of the second grooves of the second surface pattern has a pair of opposed ends which are spaced apart from the inlet port and the outlet port.

14. The heat exchanger of claim 1, wherein one or both of the inlet and outlet ports are provided in the second plate.

15. The heat exchanger of claim 14, wherein the inlet port and the outlet port are provided in the second plate, such that the first plate is free of any fluid openings.

16. The heat exchanger of claim 1, wherein the second surface pattern is provided only in areas of the second surface which are adapted to be in contact with the solid, flat surface of the object to be heated or cooled, during use of the heat exchanger.

17. The heat exchanger of claim 1, wherein the first and second plates are each comprised of aluminum or an aluminum alloy.

18. The heat exchanger of claim 1, wherein the first surface pattern of the first surface is identical to the second surface pattern of the second surface.

19. The heat exchanger of claim 1, wherein the plurality of first grooves is in vertical one-to-one alignment with the plurality of second grooves.

20. The heat exchanger of claim 1, wherein the plurality of first grooves has a same shape as the plurality of second grooves.

\* \* \* \* \*